United States Patent
Chen et al.

(10) Patent No.: US 10,229,866 B2
(45) Date of Patent: Mar. 12, 2019

(54) ON-CHIP THROUGH-BODY-VIA CAPACITORS AND TECHNIQUES FOR FORMING SAME

(71) Applicant: INTEL CORPORATION, Santa Clara, CA (US)

(72) Inventors: Yi Wei Chen, Hillsboro, OR (US); Kinyip Phoa, Beaverton, OR (US); Nidhi Nidhi, Hillsboro, OR (US); Jui-Yen Lin, Hillsboro, OR (US); Kun-Huan Shih, Portland, OR (US); Xiaodong Yang, Portland, OR (US); Walid M. Hafez, Portland, OR (US); Curtis Tsai, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/576,364

(22) PCT Filed: Jun. 22, 2015

(86) PCT No.: PCT/US2015/036905
§ 371 (c)(1),
(2) Date: Nov. 22, 2017

(87) PCT Pub. No.: WO2016/209200
PCT Pub. Date: Dec. 29, 2016

(65) Prior Publication Data
US 2018/0151474 A1    May 31, 2018

(51) Int. Cl.
| H01L 23/48 | (2006.01) |
| H01L 29/94 | (2006.01) |
| H01L 21/768 | (2006.01) |
| H01L 27/06 | (2006.01) |
| H01L 49/02 | (2006.01) |
| H01L 27/12 | (2006.01) |

(52) U.S. Cl.
CPC ...... *H01L 23/481* (2013.01); *H01L 21/76831* (2013.01); *H01L 21/76898* (2013.01);
(Continued)

(58) Field of Classification Search
CPC .............. H01L 23/481; H01L 27/1203; H01L 21/76831; H01L 21/76898
See application file for complete search history.

(56) References Cited

U.S. PATENT DOCUMENTS

| 7,338,878 B2 | 3/2008 | Ikeda |
| 8,525,296 B1 | 9/2013 | Lin et al. |

(Continued)

FOREIGN PATENT DOCUMENTS

| EP | 2816624 | 12/2014 |
| WO | 2016209200 A1 | 12/2016 |

OTHER PUBLICATIONS

International Search Report and Written Opinion received for PCT/US2015/036905. dated Mar. 18, 2016, 14 pages.
(Continued)

*Primary Examiner* — Dung Le
(74) *Attorney, Agent, or Firm* — Finch & Maloney PLLC

(57) ABSTRACT

Techniques are disclosed for providing on-chip capacitance using through-body-vias (TBVs). In accordance with some embodiments, a TBV may be formed within a semiconductor layer, and a dielectric layer may be formed between the TBV and the surrounding semiconductor layer. The TBV may serve as one electrode (e.g., anode) of a TBV capacitor, and the dielectric layer may serve as the dielectric body of that TBV capacitor. In some embodiments, the semiconductor layer serves as the other electrode (e.g., cathode) of the TBV capacitor. To that end, in some embodiments, the entire semiconductor layer may comprise a low-resistivity material, whereas in some other embodiments, low-resistivity (Continued)

region(s) may be provided just along the sidewalls local to the TBV, for example, by selective doping in those location(s). In other embodiments, a conductive layer formed between the dielectric layer and the semiconductor layer serves as the other electrode (e.g., cathode) of the TBV capacitor.

20 Claims, 14 Drawing Sheets

(52) U.S. Cl.
CPC ...... *H01L 27/0629* (2013.01); *H01L 27/1203* (2013.01); *H01L 28/90* (2013.01); *H01L 29/945* (2013.01)

(56) References Cited

U.S. PATENT DOCUMENTS

| | | | |
|---|---|---|---|
| 8,810,007 B2* | 8/2014 | Takano | H01L 23/49822 174/260 |
| 2005/0023664 A1 | 2/2005 | Chudzik et al. | |
| 2007/0272963 A1 | 11/2007 | Kishida | |
| 2008/0124886 A1* | 5/2008 | Lin | H01L 27/10855 438/386 |
| 2008/0213968 A1* | 9/2008 | Lee | H01L 27/0207 438/389 |
| 2011/0037144 A1* | 2/2011 | Chen | H01L 28/90 257/532 |
| 2011/0186964 A1 | 8/2011 | Manning | |
| 2012/0080771 A1* | 4/2012 | Yang | H01L 23/5223 257/532 |
| 2012/0133020 A1 | 5/2012 | Joblot et al. | |

OTHER PUBLICATIONS

International Preliminary Report on Patentability received for PCT/US2015/036905. dated Jan. 4, 2018, 11 pages.
European Search Report on European Patent Application No. EP 15 89 6494, completed Dec. 13, 2018, 10 pages.

* cited by examiner

ON-CHIP THROUGH-BODY-VIA CAPACITORS AND TECHNIQUES FOR FORMING SAME

BACKGROUND

A through-silicon via (TSV) is a vertical electrical connection that passes through a silicon (Si) substrate (e.g., Si wafer or die) from an upper surface thereof to an opposing lower surface thereof. Typically, a TSV is formed by first etching the Si substrate to define a through-hole passing from the upper surface to the opposing lower surface. An electrically conductive material such as copper (Cu) is then deposited in the through-hole to provide an electrical connection between the upper and lower surfaces of the substrate. TSVs may be used to interconnect multiple active circuit layers (e.g., stacked chips) in a single chip or multiple dies, thereby forming a three-dimensional integrated circuit (3D IC) or other three-dimensional package.

Figure 1A:
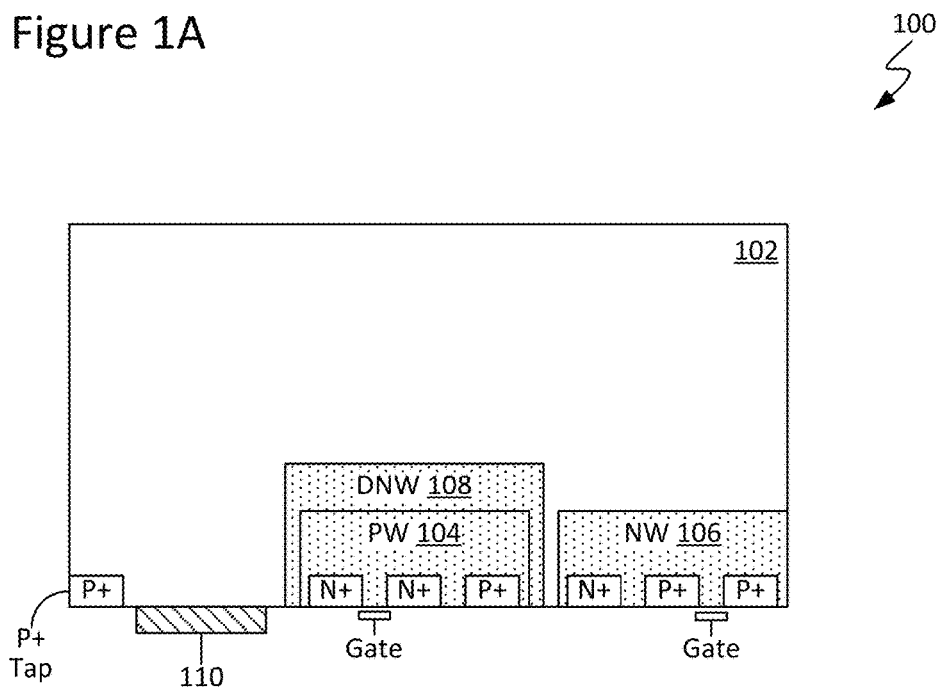
FIG. 1A is a cross-sectional view of an integrated circuit (IC), in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines, right angles, etc., and some features may have surface topography or otherwise be non-smooth, given real-world limitations of fabrication processes. In short, the figures are provided merely to show example structures.

DETAILED DESCRIPTION

Techniques are disclosed for providing on-chip capacitance using through-body-vias (TBVs). In accordance with some embodiments, a TBV may be formed within a semiconductor layer, and a dielectric layer may be formed between the TBV and the surrounding semiconductor layer. The TBV serves as one electrode (e.g., anode) of a TBV capacitor, and the dielectric layer serves as the dielectric body of that TBV capacitor. In some embodiments, the semiconductor layer in which the TBV is formed serves as the other electrode (e.g., cathode) of the TBV capacitor. To that end, in some embodiments, the entire semiconductor layer comprises a low-resistivity material, whereas in some other embodiments, low-resistivity region(s) are provided just along the sidewalls local to the TBV, for example, by doping the semiconductor material in those selected location(s). In accordance with some other embodiments, rather than utilizing a low-resistivity semiconductor material for one of the electrodes, the second electrode of the TBV capacitor can be realized by providing a conductive layer between the semiconductor layer and the dielectric layer, resulting in a metal-insulator-metal (MIM)-type of capacitive structure. In some such cases, a dual-TBV capacitor configuration is provided, wherein one of a pair of neighboring TBVs is a part of the MIM-type capacitive structure and provides front side access to the cathode, and the other TBV of the pair is electrically connected with the conductive material of the first TBV and provides front side access to the anode of the capacitor. Back side access is available as well, in some such embodiments. Numerous configurations and variations, as well as forming methods, will be apparent in light of this disclosure.

General Overview

The capacitors and batteries of modern electronics typically involve off-chip elements that occupy significant real estate or on-chip elements that can provide only very small capacitance. Modern off-chip capacitors are generally too large in size for use in compact mobile computing devices, such as smartphones. Furthermore, although through-silicon vias (TSVs) can be connected with front-end circuits and used to pass signals between stacked dies, it is normally desirable to minimize their capacitance, which otherwise would introduce significant signal delay.

Thus, and in accordance with some embodiments of the present disclosure, techniques are disclosed for providing on-chip capacitance using through-body-vias (TBVs). In accordance with some embodiments, a TBV may be formed within a semiconductor layer, and a dielectric layer may be formed between the TBV and the surrounding semiconductor layer. The TBV may be configured to serve as one of the conductor bodies of a TBV capacitor (e.g., anode), and the dielectric layer may be configured to serve as the dielectric body of that TBV capacitor. In some embodiments, the semiconductor layer may be formed from a low-resistivity material and thus may serve as the other of the conductor bodies of the TBV capacitor (e.g., cathode). In some cases, the low-resistivity material may be, for example, one or more doped areas of a bulk substrate (e.g., dopant provided along sidewalls of a TBV). In other cases, the low-resistivity material may be doped regions of a semiconductor layer of a semiconductor-on-insulator (SOI) structure or some other substrate layer in which the TBV is formed. In still other embodiments, use of such low-resistivity semiconductor substrate regions can be avoided, for instance, by providing a conductive layer between the substrate and the dielectric layer to serve as the other of the conductor bodies of the TBV capacitor (e.g., cathode), providing a metal-insulator-metal (MIM)-type of capacitive structure, of which the TBV is a component. Various configurations can be implemented to provide either front side or back side access to the cathode and anode of a TBV capacitor provided as described herein, as will be appreciated in light of this disclosure.

As will be further appreciated in light of this disclosure, the three-dimensional geometry of high-aspect ratio TBV capacitors configured as described herein may provide a conductive surface area that is much larger than that offered by traditional metal-insulator-metal (MIM) capacitors and other typical two-dimensional on-chip capacitors, in accordance with some embodiments. When formed by interfacing a TBV with surrounding low-resistivity semiconductor material through a dielectric layer of sufficiently high dielectric constant ($\kappa$) and sufficiently low thickness, the resulting TBV capacitor(s) can contribute very large on-chip capacitance. For instance, in some cases, a TBV capacitor configured as described herein may provide capacitance that is greater (e.g., about 2×, about 5×, about 10× or greater) than that of a typical MIM capacitor. In accordance with some embodiments, the amount of on-chip capacitance provided can be tuned, as desired for a given target application or end-use, by increasing the thickness of the surrounding semiconductor layer (e.g., doped substrate region), reducing the thickness of the dielectric layer, forming the dielectric layer from a dielectric material of higher dielectric constant ($\kappa$), stacking multiple chips together, or a combination of any of these.

In accordance with some embodiments, the disclosed techniques can be used, for example, for monolithic on-chip integration of high-capacitance components and may be generally compatible with existing complementary metal-oxide-semiconductor (CMOS) fabrication processes. In some instances, the disclosed techniques can be used to provide low-cost NAND and system-on-chip (SoC) integration of on-chip capacitance. In some cases, on-chip TBV-based capacitance may be provided for use in storing electricity in a battery design. In some instances, such an on-chip battery can be configured to store energy harvested, for example, from solar energy, thermal energy, or any other suitable source. In some other cases, on-chip TBV-based capacitance may be provided for use in generating and discharging a high-voltage pulse in a charge-pump circuit design. In some instances, on-chip TBV-based capacitance provided as described herein can be recharged after discharge (e.g., when used in a battery mode). In some cases, the disclosed techniques can be used, for example, to reduce signal delay, to reduce total bill of materials (BoM) cost, or both, as compared to existing off-chip approaches. Numerous suitable uses and applications will be apparent in light of this disclosure.

In accordance with some embodiments, use of techniques disclosed herein may be detected, for example, by visual or other inspection, such as by cross-sectional scanning electron microscopy (SEM) or any other suitable microscopy technique, as will be apparent in light of this disclosure, of a given integrated circuit or other device having a through-body-via (TBV) capacitor configured as described herein.

Methodologies and Structure

FIGS. 1A-1D illustrate an integrated circuit (IC) fabrication process flow, in accordance with an embodiment of the present disclosure. The process may begin as in FIG. 1A, which is a cross-sectional view of an integrated circuit (IC) 100, in accordance with an embodiment of the present disclosure. The semiconductor layer 102 of IC 100 can be formed from any suitable semiconductor material(s), such as, for example, silicon, germanium, silicon germanium, silicon germanium carbide, silicon carbide, a III-V compound semiconductor such as gallium arsenide, indium arsenide, indium phosphide, gallium nitride, or indium gallium arsenide, or a combination of any thereof, among others. In an example case, semiconductor layer 102 may be p-doped silicon. Semiconductor layer 102 can be configured as any one, or combination, of a bulk semiconductor substrate, a semiconductor-on-insulator (e.g., silicon-on-insulator, or SOI) structure, a semiconductor wafer, or a multi-layered structure, for example.

In accordance with some embodiments, semiconductor layer 102 may be formed from a low-resistivity material, which can be accomplished, for example, by maximizing or otherwise increasing dopant concentration, allowing semiconductor layer 102 to serve as a metal-like electrode for TBV capacitor 118 (discussed below with reference to FIG. 1D). For instance, in some example cases, semiconductor layer 102 may be formed from a material having a resistivity in the range of about 0.001-10.0 Ω·cm (e.g., ±10%). Note that the doping scheme can be throughout the bulk semiconductor substrate or layer 102, or it can be selectively provisioned along the sidewalls local to the TBV 116 so as to provide one electrode of the TBV capacitor 118. To such ends, any suitable dopant(s), dopant concentration(s), and doping process(es) may be used, as will be apparent in light of this disclosure. In other instances, such as those discussed below with respect to FIGS. 4A-4F and 5A-5G, for example, a semiconductor layer 102 of any resistivity may be used; for instance, in some embodiments, semiconductor layer 102 may be formed from a material having a resistivity greater than about 10.0 Ω·cm (e.g., greater than about 25 Ω·cm, greater than about 50 Ω·cm).

The dimensions of semiconductor layer 102 can be customized, as desired for a given target application or end-use. As will be appreciated in light of this disclosure, it may be desirable to ensure that semiconductor layer 102 is of sufficient thickness, for example, to permit formation of one or more TBV capacitors 118 of sufficient dimensions to provide the amount of TBV capacitance desired for a given target application or end-use.

In accordance with some embodiments, semiconductor layer 102 may have undergone complementary metal-oxide-semiconductor (CMOS) processing. For instance, in some cases, a p-well (PW) 104 with one or more n+ and p+ doped regions may be formed in semiconductor layer 102. In some such cases, the p-well 104 may be disposed within a deep n-well (DNW) 108, which may provide electrical isolation between semiconductor layer 102 and other circuit component(s) of IC 100. In some cases, an n-well (NW) 106 with one or more n+ and p+ doped regions may be formed in semiconductor layer 102. In some instances, semiconductor layer 102 may have one or more p+ taps formed therein. In some instances, additional ion implantation may be provided to increase dopant concentration, for example, at the side-walls of a given opening 112 (discussed below with reference to FIG. 1B), so as to provide a given desired degree of low-resistivity. Doping of a given p-well 104, n-well 106, deep n-well 108, or other portion of semiconductor layer 102 may be provided as typically done, and the dopant type and concentration can be customized, as desired for a given target application or end-use.

In accordance with some embodiments, front-end transistor device(s) may be formed over semiconductor layer 102. To that end, gate(s) can be provided over a given p-well 104 (optionally with deep n-well 108) or n-well 106, as typically done. A given gate can be formed from any suitable gate material, such as an electrically conductive metal or poly-silicon (poly-Si), and the gate dimensions can be customized, as desired for a given target application or end-use. In addition, drain (D), source (S), and base (B) connections can be provided for a given p-type metal-oxide-semiconductor (PMOS) device or n-type metal-oxide-semiconductor (NMOS) device of IC 100 (e.g., as can be seen with respect to FIG. 1D). When optionally included, deep n-well 108 may serve to isolate the NMOS device (or other circuit components) of IC 100 from the surrounding semiconductor layer 102, which, as previously noted, may be p-doped Si in some cases.

In accordance with some embodiments, conductive line(s) 110 may be formed over semiconductor layer 102. A given conductive line 110 may be configured, for example, as an interconnect or other typical frontend routing, among others. A given conductive line 110 can be formed from any suitable electrically conductive material, such as, for example, copper, aluminum, nickel, cobalt, or a combination of any thereof, among others. Conductive line(s) 110 can be formed over IC 100, for example, using a chemical vapor deposition (CVD) process, a physical vapor deposition (PVD) process, an atomic layer deposition (ALD) process, or a combination of any thereof, among others. Furthermore, the dimensions of a given conductive line 110 can be customized, as desired for a given target application or end-use.

Figure 1B:
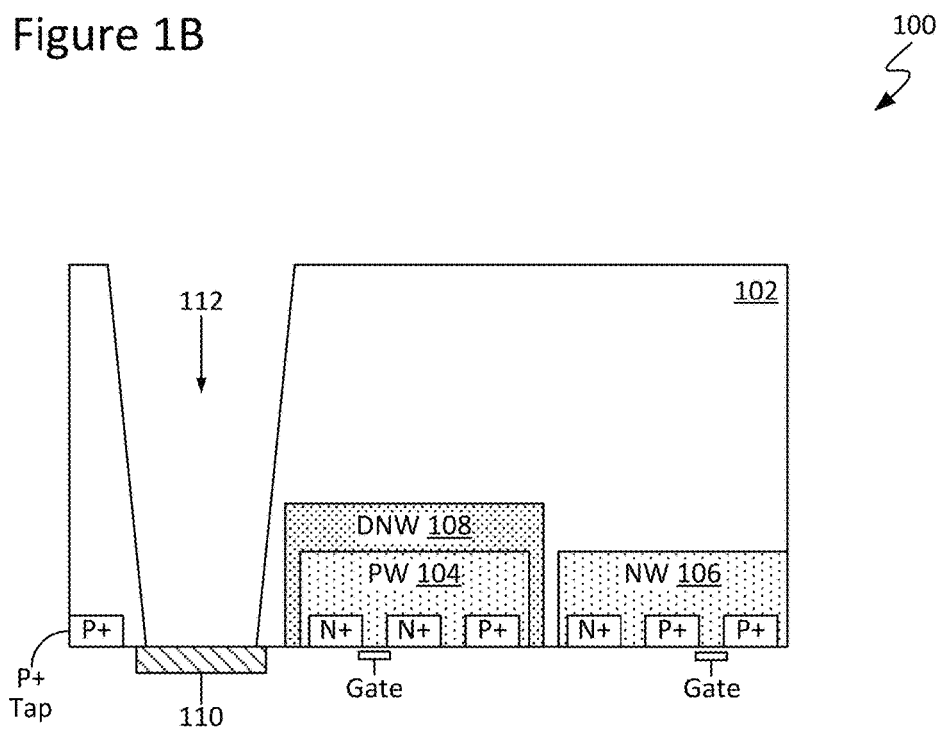
FIG. 1B is a cross-sectional view of the IC of FIG. 1A after forming an opening in a semiconductor layer thereof, in accordance with an embodiment of the present disclosure.

The process may continue as in FIG. 1B, which is a cross-sectional view of the IC 100 of FIG. 1A after forming an opening 112 in semiconductor layer 102, in accordance with an embodiment of the present disclosure. A given opening 112 can be formed using any suitable patterning technique, as will be apparent in light of this disclosure. For example, a given opening 112 may be formed using a directional dry etching process such as, for example, reactive-ion etching (RIE), ion beam etching, plasma etching, laser ablation, or a combination thereof, among others. The etch chemistry can be customized, as desired, and in some instances may be one compatible with pulsed or time-multiplexed (e.g., Bosch process) etching. In some cases, a given opening 112 may extend through the entire thickness of semiconductor layer 102 (e.g., be configured as a through-hole passing from a first surface of semiconductor layer 102 to a second surface thereof). In some other cases, a given opening 112 may extend through only a portion of the thickness of semiconductor layer 102.

As can be seen with respect to FIGS. 1A-1D, a given opening 112 may be formed, for example, from the back side of semiconductor layer 102 so as to land, in part or in whole, on an underlying conductive line 110 formed over the front side of semiconductor layer 102, in accordance with some embodiments. Thus, in a sense, such an opening 112 and underlying conductive line 110 may serve as a so-called catch-cup, with that conductive line 110 routing the TBV 116 (see FIG. 1D) from the catch-cup to other circuit component(s).

As discussed herein, a given opening 112 may be configured to host, at least in part, a dielectric layer 114 and a TBV 116 (e.g., as discussed below with reference to FIGS. 1C-1D), in accordance with some embodiments. Also, as discussed herein, a given opening 112 alternatively (or additionally) may be configured to host, at least in part, an isolation liner layer 126 and a conductive layer 128 (e.g., as discussed below with reference to FIGS. 4C-4D and 5C-5D), in accordance with some embodiments. As will be appreciated, isolation liner layer 126 may serve, for example, to electrically isolate the material of conductive layer 128 (e.g., formed in an opening 112) from the surrounding semiconductor layer 102, as well as prevent diffusion of the material of conductive layer 128 into that semiconductor layer 102. As will be further appreciated, such an isolation liner layer 126 may not be needed, for instance, when semiconductor layer 102 (e.g., one or more doped regions along the sidewall of opening 112) provides an electrode for the TBV capacitor 118 (e.g., as can be seen generally with respect to FIGS. 1A-1D, 2A-2D, and 3A-3C).

The dimensions and geometry of a given opening 112 can be customized, as desired for a given target application or end-use. In some instances, a given opening 112 may have a width/diameter in the range of about 5-30 µm (e.g., about 5-15 µm, about 15-30 µm, or any other sub-range in the range of about 5-30 µm). In some cases, a given opening 112 may have a substantially uniform width/diameter along its length, whereas in some other cases, a given opening 112 may have a non-uniform or otherwise varying width/diameter along its length (e.g., a first portion of opening 112 may have a width/diameter within a first range, whereas a second portion thereof may have a width/diameter within a second, different range). In some instances, a given opening 112 may have a length in the range of about 50-150 µm (e.g., about 50-75 µm, about 75-100 µm, about 100-125 µm, about 125-150 µm, or any other sub-range in the range of about 50-150 µm). In some example cases, a given opening 112 may have a length-to-width aspect ratio (AR) of 5:1 or less, 10:1 or less, 15:1 or less, or 20:1 or less. In some other example cases, a given opening 112 may have a length-to-width AR of 5:1 or greater, 10:1 or greater, 15:1 or greater, or 20:1 or greater. As a result of the etch technique(s) utilized, a given opening 112 may exhibit an isotropic or anisotropic profile. In some instances, a given opening 112 may be generally cylindrical in shape (e.g., with sidewalls that are substantially vertically straight). In some other instances, such as that generally shown in FIG. 1B, a given opening 112 may have the shape of a conical frustum (e.g., with sidewalls that taper). In a more general sense, the profile of a given opening 112 can be tuned based on the etch process and recipe utilized in its formation, as desired for a given target application or end-use.

Figure 1C:
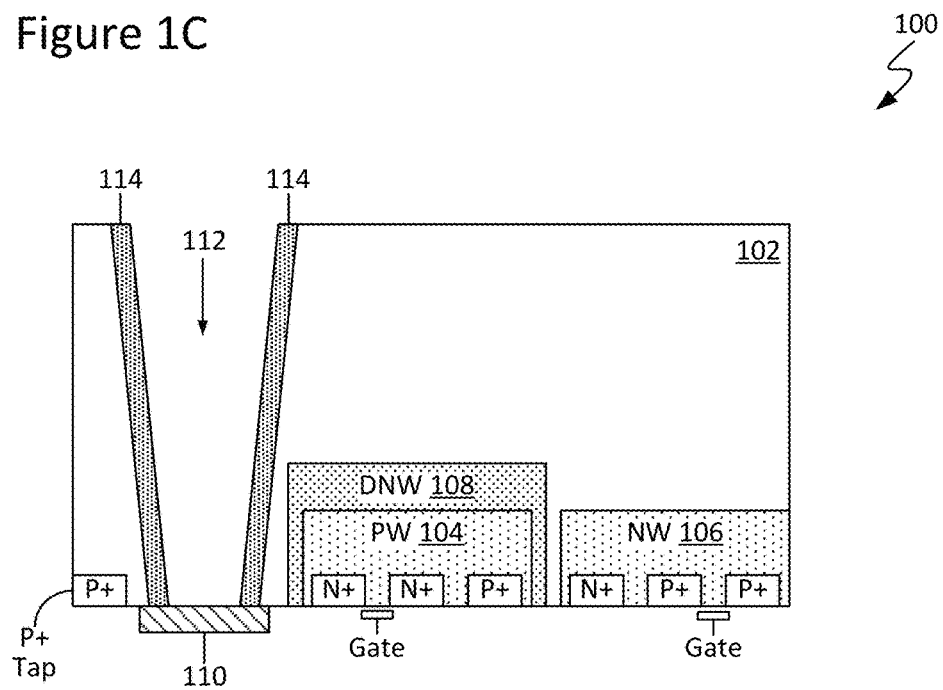
FIG. 1C is a cross-sectional view of the IC of FIG. 1B after forming a liner layer in the opening, in accordance with an embodiment of the present disclosure.

The process may continue as in FIG. 1C, which is a cross-sectional view of the IC 100 of FIG. 1B after forming a dielectric layer 114 in opening 112, in accordance with an embodiment of the present disclosure. Dielectric layer 114 can be formed from any of a wide range of dielectric material(s), including, for example, silicon dioxide, silicon nitride, silicon carbide, aluminum oxide, and a high-κ dielectric material such as hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some cases, an annealing process may be carried out on the dielectric layer 114 to improve its quality, for instance, when a high-κ material is used. In still other embodiments, dielectric layer 114 can be implemented with a polymer (or blend of polymers) such as polyimide. In still other embodiments, dielectric layer 114 can be implemented with a combination of any the various dielectric materials provided in this paragraph, among others. As will be appreciated in light of this disclosure, the use of high-κ dielectric materials (e.g., having a dielectric constant κ greater than or equal to that of $SiO_2$) may help to maximize TBV capacitance. Dielectric layer 114 can be formed over IC 100, for example, using an atomic layer deposition (ALD) process, a physical vapor deposition (PVD) process, a chemical vapor deposition (CVD) process, or a combination of any thereof, among others.

Furthermore, the dimensions of dielectric layer 114 can be customized, as desired for a given target application or end-use. In some cases, dielectric layer 114 may have a thickness in the range of about 5-20 nm (e.g., about 5-10 nm, about 10-15 nm, about 15-20 nm, or any other sub-range in the range of about 5-20 nm). In a more general sense, the thickness of the dielectric material should be sufficient to electrically isolate the electrodes of the TBV capacitor (e.g., outer and inner electrodes; top and bottom electrodes) from one another so as to avoid short-circuiting of the TBV capacitor in a given application. In some instances, dielectric layer 114 may have a substantially uniform thickness over the topography provided by a given opening 112, whereas in some other instances, dielectric layer 114 may have a non-uniform or otherwise varying thickness over such topography (e.g., a first portion of dielectric layer 114 may have a thickness within a first range, whereas a second portion thereof may have a thickness within a second, different range). In some instances, dielectric layer 114 may be substantially conformal to the underlying topography provided by a given opening 112. In a more general sense, and in accordance with an embodiment, the thickness(es) of dielectric layer 114 can be tuned to provide the amount of TBV capacitance desired for a given target application or end-use.

Figure 1D:
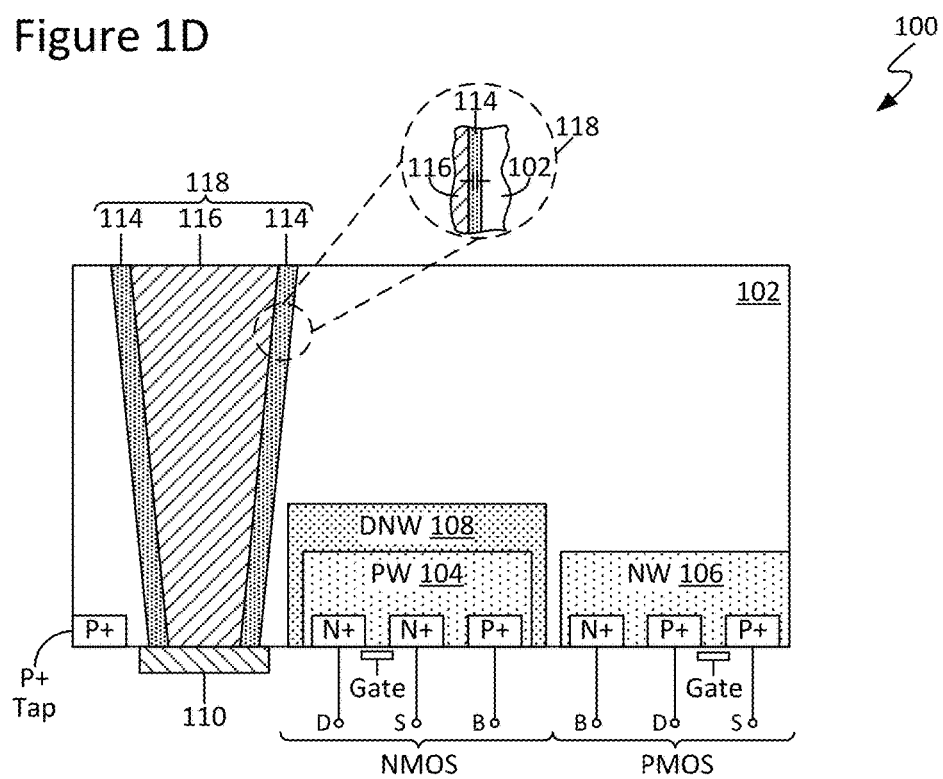
FIG. 1D is a cross-sectional view of the IC of FIG. 1C after forming a through-body via (TBV) in the opening, in accordance with an embodiment of the present disclosure.

The process may continue as in FIG. 1D, which is a cross-sectional view of the IC 100 of FIG. 1C after forming a through-body via (TBV) 116 in opening 112, in accordance with an embodiment of the present disclosure. A given TBV 116 can be formed from any suitable electrically conductive material(s), such as any of those example materials discussed above, for instance, with respect to conductive line(s) 110, in accordance with some embodiments. A given TBV 116 can be formed, for example, using an electroplating process, an electroless deposition process, or a combination of any thereof, among others. In some instances, a seed layer optionally may be formed over dielectric layer 114 prior to bulk filling with the TBV 116 material.

The dimensions and geometry of a given TBV 116 can be customized, as desired for a given target application or end-use, and as will be appreciated in light of this disclosure, may be of any of the example dimensions and geometries discussed above, for instance, with respect to a given opening 112 hosting such TBV 116, in accordance with some embodiments. In some example cases, a given TBV 116 may have a width/diameter in the range of about 5-10 µm and a length in the range of about 100-150 µm. In some example cases, a given TBV 116 may have a length-to-width aspect ratio (AR) of 5:1 or less, 10:1 or less, 15:1 or less, or 20:1 or less. In some other example cases, a given TBV 116 may have a length-to-width AR of 5:1 or greater, 10:1 or greater, 15:1 or greater, or 20:1 or greater.

In accordance with an embodiment, the combination of the bulk TBV 116, surrounding doped or otherwise low-resistance semiconductor layer 102, and intervening dielectric layer 114 sandwiched there between provides a TBV capacitor 118, as can be seen, for instance, from the enlarged view enclosed by the dashed circle in FIG. 1D. As will be appreciated in light of this disclosure, and in accordance with some embodiments, an array of such TBV capacitors 118 can be formed in semiconductor layer 102 to provide the amount of TBV capacitance desired for a given target application or end-use.

FIGS. 2A-2D illustrate an integrated circuit (IC) fabrication process flow, in accordance with another embodiment of the present disclosure. The process may begin as in FIG. 2A, which is a cross-sectional view of an integrated circuit (IC) 100, in accordance with an embodiment of the present disclosure. As can be seen here, the semiconductor layer 102 of IC 100 may have undergone CMOS processing, as discussed above. As can be seen further, IC 100 may include a dielectric layer 120 formed over semiconductor layer 102 (e.g., over a back side thereof), in accordance with some embodiments. In some instances, dielectric layer 120 may be configured to serve as an etch stop layer. Dielectric layer 120 can be formed from any of the example materials discussed above, for instance, with respect to dielectric layer 114, in accordance with some embodiments. Dielectric layer 120 can be formed over IC 100, for example, using a physical vapor deposition (PVD) process such as sputter deposition, a chemical vapor deposition (CVD) process such as plasma-enhanced CVD (PECVD), or a combination of any thereof, among others.

Furthermore, the dimensions of dielectric layer 120 can be customized, as desired for a given target application or end-use. In some cases, dielectric layer 120 may have a thickness in the range of about 0.1-1.0 μm (e.g., about 0.1-0.5 μm, about 0.5-1.0 μm, or any other sub-range in the range of about 0.1-1.0 μm). In some instances, dielectric layer 120 may have a substantially uniform thickness over the topography provided by semiconductor layer 102, whereas in some other instances, dielectric layer 120 may have a non-uniform or otherwise varying thickness over such topography (e.g., a first portion of dielectric layer 120 may have a thickness within a first range, whereas a second portion thereof may have a thickness within a second, different range). In some instances, dielectric layer 120 may be substantially conformal to the underlying topography provided by semiconductor layer 102.

Figure 2A:
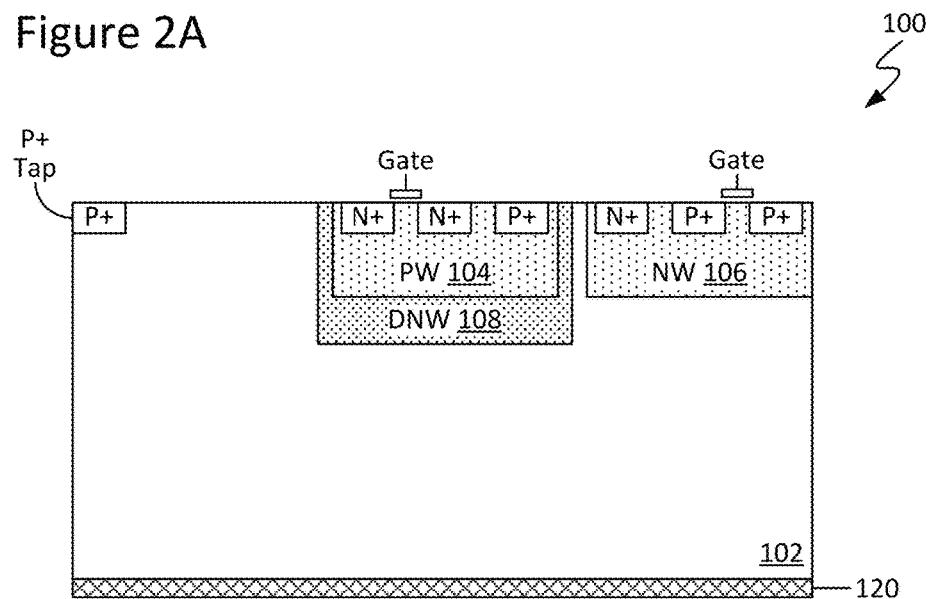
FIG. 2A is a cross-sectional view of an integrated circuit (IC), in accordance with another embodiment of the present disclosure.
Figure 2B:
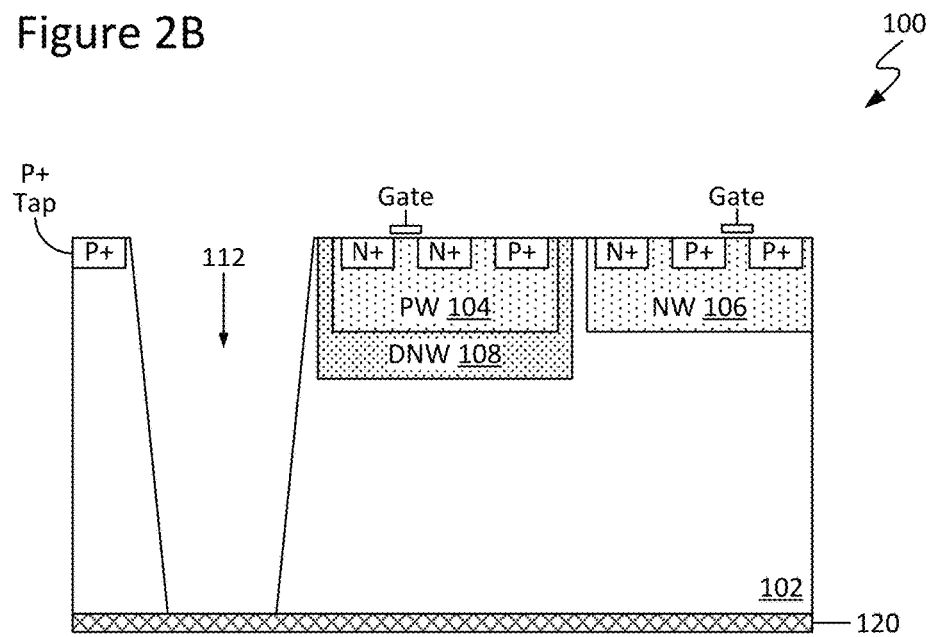
FIG. 2B is a cross-sectional view of the IC of FIG. 2A after forming an opening in a semiconductor layer thereof, in accordance with an embodiment of the present disclosure.

The process may continue as in FIG. 2B, which is a cross-sectional view of the IC 100 of FIG. 2A after forming an opening 112 in semiconductor layer 102, in accordance with an embodiment of the present disclosure. As can be seen with respect to FIGS. 2A-2D, a given opening 112 may be formed, for example, from the front side of semiconductor layer 102 so as to land on dielectric layer 120 formed over the back side of semiconductor layer 102, in accordance with some embodiments.

Figure 2C:
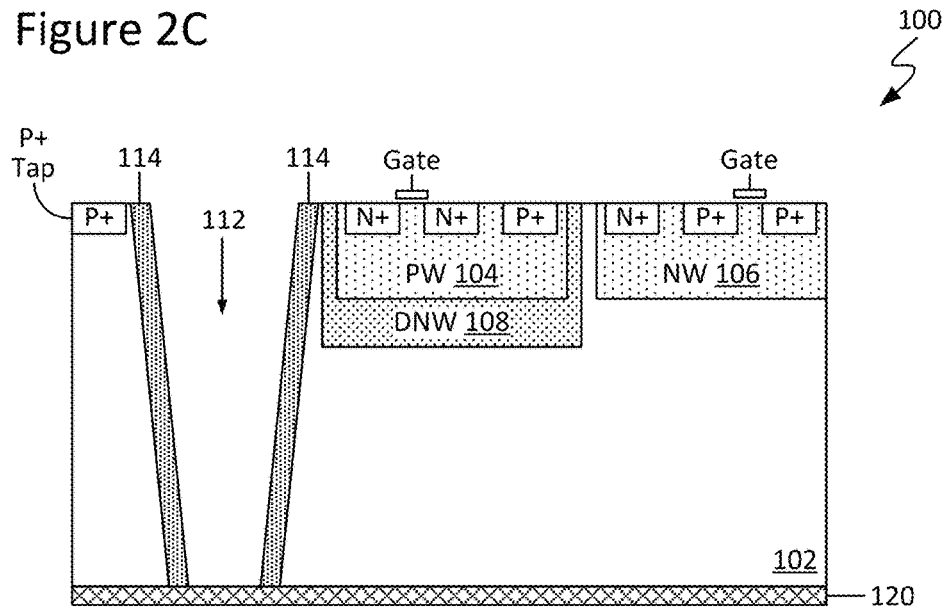
FIG. 2C is a cross-sectional view of the IC of FIG. 2B after forming a liner layer in the opening, in accordance with an embodiment of the present disclosure.
Figure 2D:
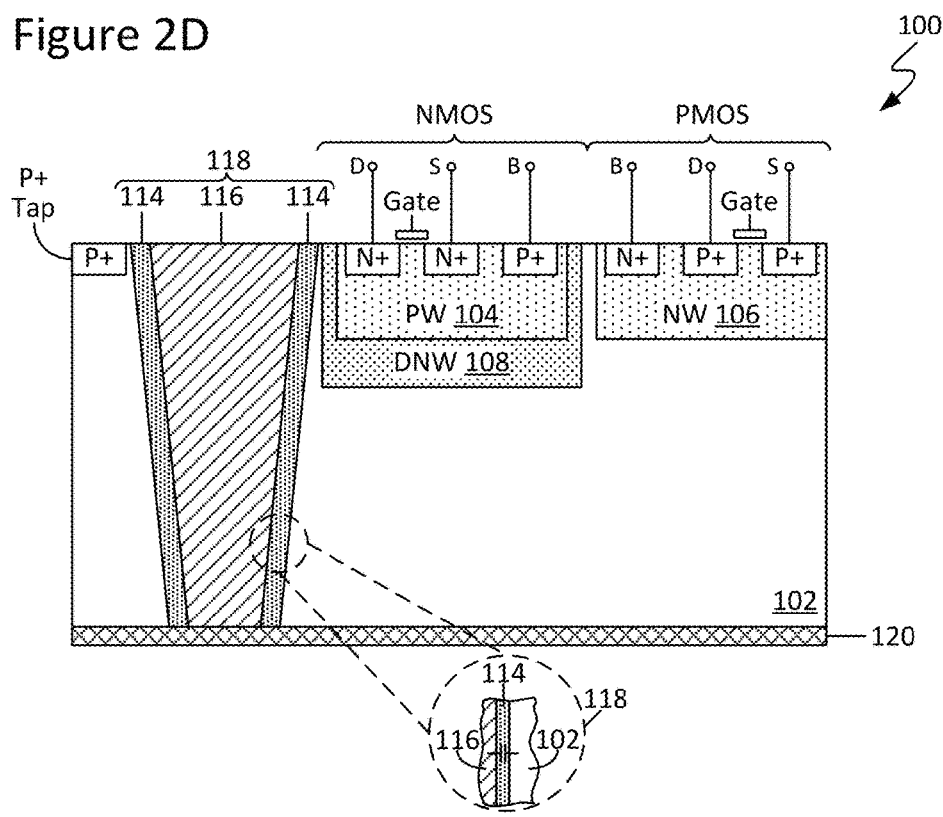
FIG. 2D is a cross-sectional view of the IC of FIG. 2C after forming a through-body via (TBV) in the opening, in accordance with an embodiment of the present disclosure.

The process may continue as in FIG. 2C, which is a cross-sectional view of the IC 100 of FIG. 2B after forming a dielectric layer 114 in opening 112, and as in FIG. 2D, which is a cross-sectional view of the IC 100 of FIG. 2C after forming a through-body via (TBV) 116 in opening 112, in accordance with some embodiments of the present disclosure. Additional CMOS backend processing may be performed, for example, to connect TBV 116 to other circuit component(s).

In accordance with an embodiment, the combination of the bulk TBV 116, surrounding doped or otherwise low-resistance semiconductor layer 102, and intervening dielectric layer 114 sandwiched there between provides a TBV capacitor 118, as can be seen, for instance, from the enlarged view enclosed by the dashed circle in FIG. 2D. As will be appreciated in light of this disclosure, and in accordance with some embodiments, an array of such TBV capacitors 118 can be formed in semiconductor layer 102 to provide the amount of TBV capacitance desired for a given target application or end-use.

FIGS. 3A-3D illustrate an integrated circuit (IC) fabrication process flow, in accordance with another embodiment of the present disclosure. The process may begin as in FIG. 3A, which is a cross-sectional view of an IC 100, in accordance with an embodiment of the present disclosure. As can be seen here, the semiconductor layer 102 of IC 100 may be formed as a semiconductor-on-insulator or so-called SOI structure (e.g., silicon-on-insulator, or other SOI structure) having an insulator layer 122 buried therein. Insulator layer 122 may be formed using any suitable process, such as, for example, an ion beam implantation process with subsequent high-temperature annealing. In an example case, semiconductor layer 102 may undergo implantation of oxygen ions ($O^+$) that are subsequently converted to produce the buried insulator layer 122. Thus, if semiconductor layer 102 is silicon, for example, then the buried insulator layer 122 may be $SiO_2$. In addition, the semiconductor layer 102 of IC 100 may have undergone CMOS processing, as discussed above. The isolation provided by the semiconductor-on-insulator configuration may be confined only to the front-end circuit (s) of IC 100, ensuring that the p+ tap bias on a given TBV 116 (discussed below with reference to FIG. 4D) does not impact (or otherwise negligibly impacts) those front-end circuit(s). As will be further noted, unlike the semiconductor layers 102 discussed above with respect to FIGS. 1A-1D and 2A-2D, the semiconductor layer 102 of FIGS. 3A-3D does not include a deep n-well (DNW) 108.

Figure 3A:
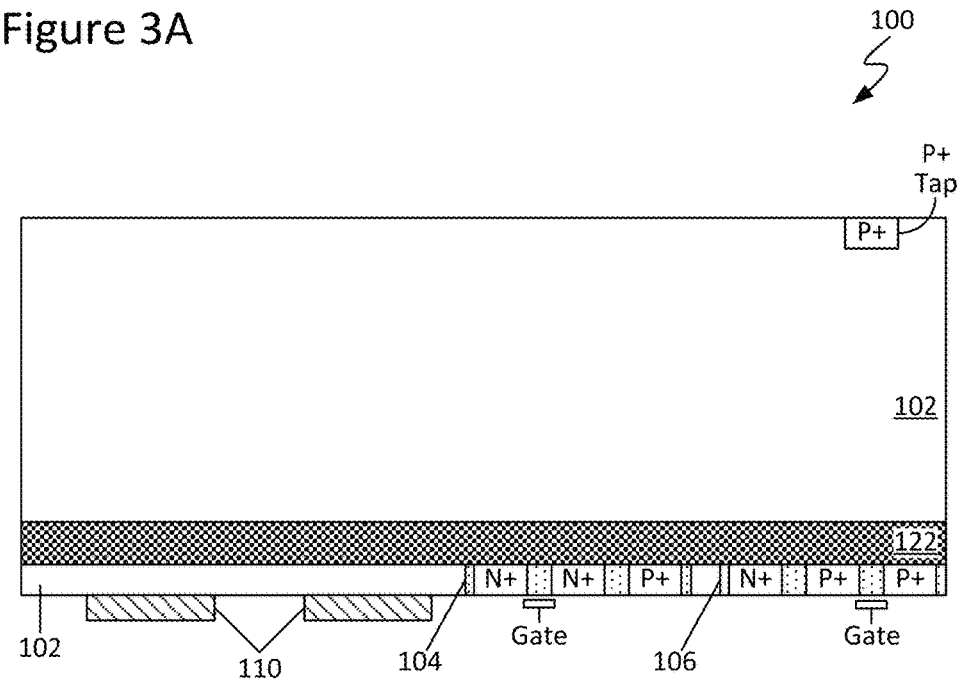
FIG. 3A is a cross-sectional view of an integrated circuit (IC), in accordance with another embodiment of the present disclosure.
Figure 3B:
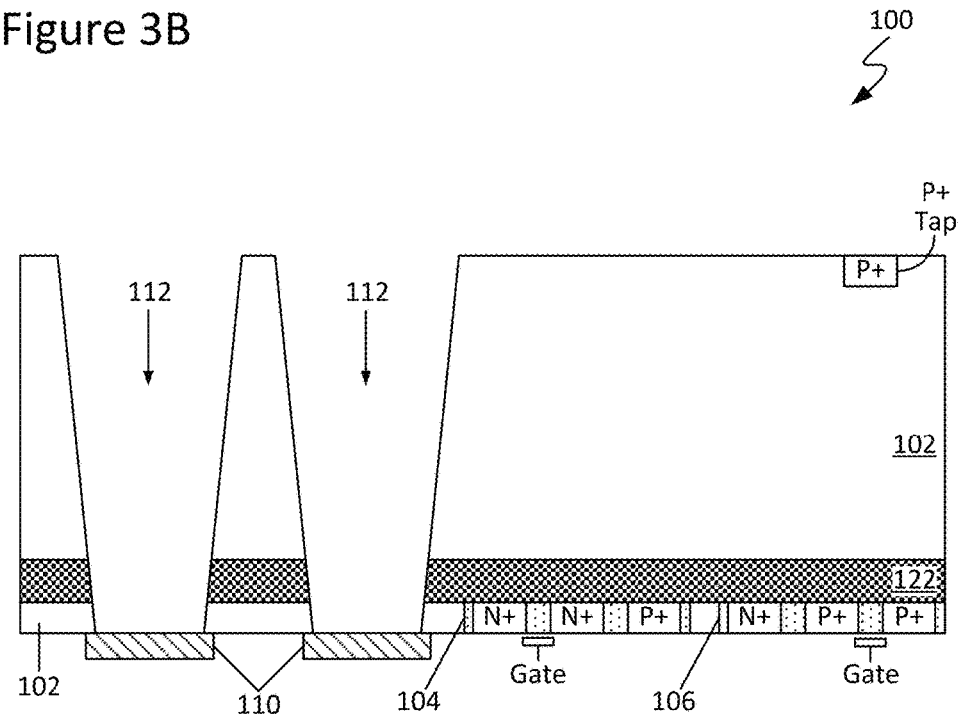
FIG. 3B is a cross-sectional view of the IC of FIG. 3A after forming one or more openings in a semiconductor layer thereof, in accordance with an embodiment of the present disclosure.

The process may continue as in FIG. 3B, which is a cross-sectional view of the IC 100 of FIG. 3A after forming opening(s) 112 in semiconductor layer 102, in accordance with an embodiment of the present disclosure. As can be seen with respect to FIGS. 3A-3D, a given opening 112 may be formed, for example, from the back side of semiconductor layer 102 so as to land, in part or in whole, on an underlying conductive line 110 formed over the front side of semiconductor layer 102, in accordance with some embodiments. In so doing, a given opening 112 may pass through the thickness of insulator layer 122, as well as any remaining front side semiconductor layer 102 material (e.g., the active layer in which one or more CMOS devices may be formed). Thus, in a sense, such an opening 112 and underlying conductive line 110 may serve as a so-called catch-cup, with that conductive line 110 routing the TBV 116 (see FIG. 4D) from the catch-cup to other circuit component(s).

Figure 3C:
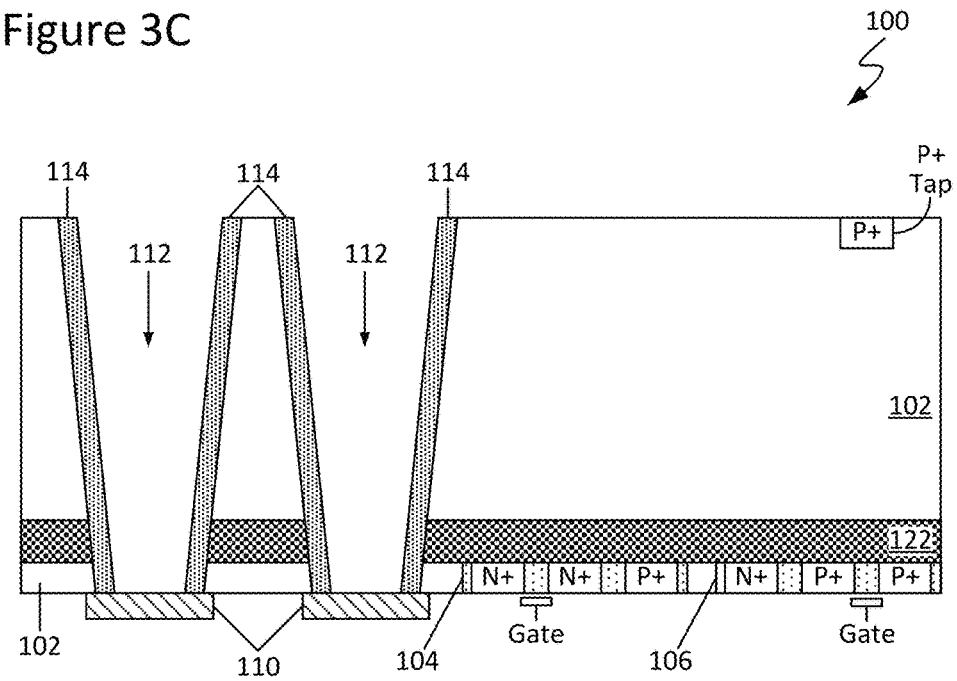
FIG. 3C is a cross-sectional view of the IC of FIG. 3B after forming a liner layer in the one or more openings, in accordance with an embodiment of the present disclosure.
Figure 3D:
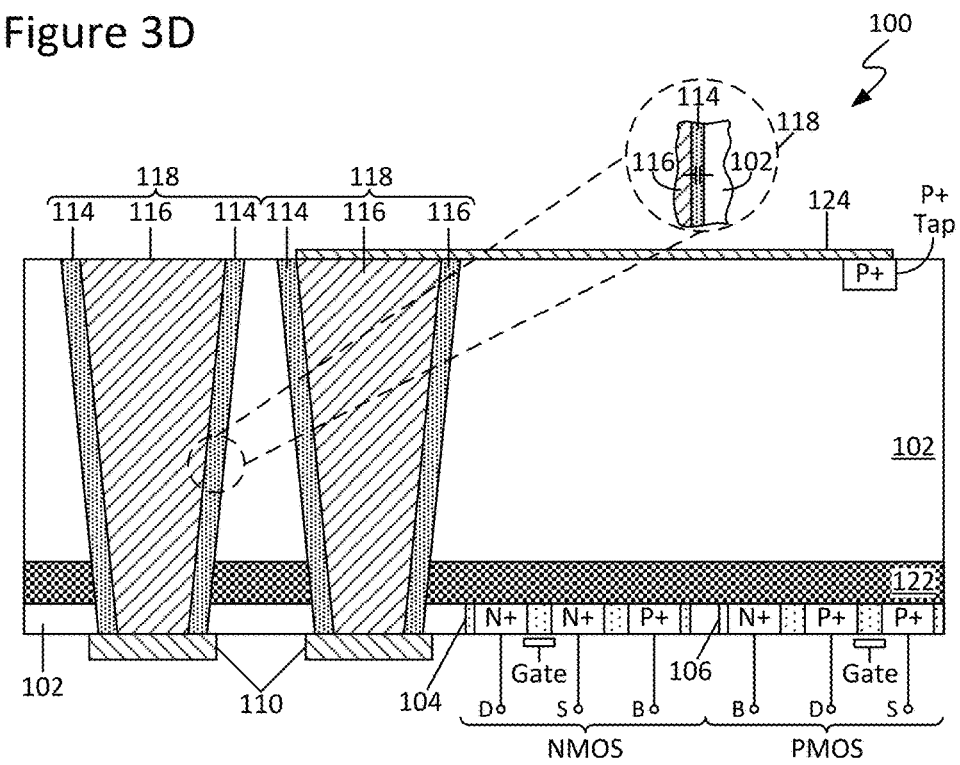
FIG. 3D is a cross-sectional view of the IC of FIG. 3C after forming a through-body via (TBV) in the one or more openings, in accordance with an embodiment of the present disclosure.

The process may continue as in FIG. 3C, which is a cross-sectional view of the IC 100 of FIG. 3B after forming a dielectric layer 114 in each opening 112, and as in FIG. 3D, which is a cross-sectional view of the IC 100 of FIG. 3C after forming a through-body via (TBV) 116 in each opening 112, in accordance with some embodiments of the present disclosure. Additional CMOS backend processing may be performed, for example, to connect TBV 116 to other circuit component(s). As can be seen, a p+ tap on the back side of semiconductor layer 102 may be electrically contacted with one of the TBVs 116 by a metal line 124. Metal line 124 can be formed from any of the example electrically conductive materials discussed above, for instance, with respect to conductive line(s) 110, in accordance with some embodiments. In a sense, providing the p+ tap contact via metal line 124 sacrifices one TBV 116 out of the array thereof.

In accordance with an embodiment, the combination of the bulk TBV 116, surrounding doped or otherwise low-resistance semiconductor layer 102, and intervening dielectric layer 114 sandwiched there between provides a TBV capacitor 118, as can be seen, for instance, from the enlarged view enclosed by the dashed circle in FIG. 3D. As will be appreciated in light of this disclosure, and in accordance with some embodiments, an array of such TBV capacitors 118 can be formed in semiconductor layer 102 to provide the amount of TBV capacitance desired for a given target application or end-use.

FIGS. 4A-4F illustrate an integrated circuit (IC) fabrication process flow, in accordance with another embodiment of the present disclosure. As can be seen, the embodiment effectively provides a dual-TBV capacitor configuration, wherein one of a pair of neighboring TBVs is a part of a MIM-type structure and provides front side access to the cathode (or anode) of the capacitor, and the other TBV is electrically connected to an upper portion of the first TBV and provides front side access to the anode (or cathode) of the capacitor. Back side access is available as well, in some such embodiments.

Figure 4A:
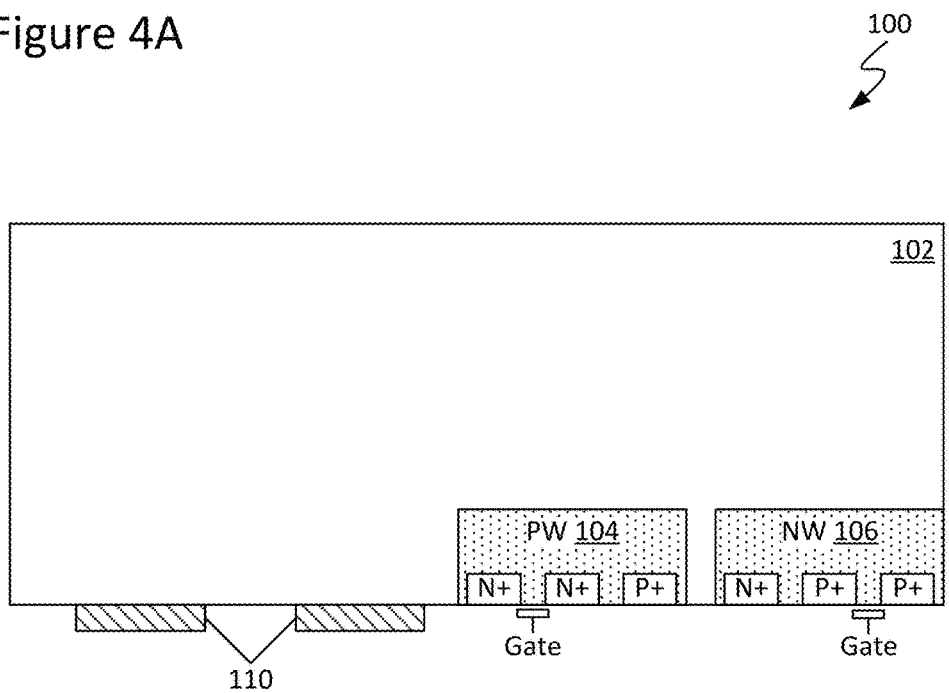
FIG. 4A is a cross-sectional view of an integrated circuit (IC), in accordance with another embodiment of the present disclosure.

The process may begin as in FIG. 4A, which is a cross-sectional view of an integrated circuit (IC) 100, in accordance with an embodiment of the present disclosure. As will be noted, as compared to the IC 100 in FIG. 1A, for example, the IC 100 here in FIG. 4A does not utilize a low-resistivity semiconductor layer 102 or a deep n-well (DNW) 108, semiconductor-on-insulator isolation, or one or more p+ taps. The process may continue as in FIG. 4B, which is a cross-sectional view of the IC 100 of FIG. 4A after forming opening(s) 112 in semiconductor layer 102, in accordance with an embodiment of the present disclosure. As can be seen with respect to FIGS. 4A-4F, a given opening 112 may be formed, for example, from the back side of semiconductor layer 102 so as to land, in part or in whole, on an underlying conductive line 110 formed over the front side of semiconductor layer 102, in accordance with some embodiments. Thus, in a sense, such an opening 112 and underlying conductive line 110 may serve as a so-called catch-cup, with that conductive line 110 routing the TBV 116 (see FIG. 4F) from the catch-cup to other circuit component(s).

Figure 4B:
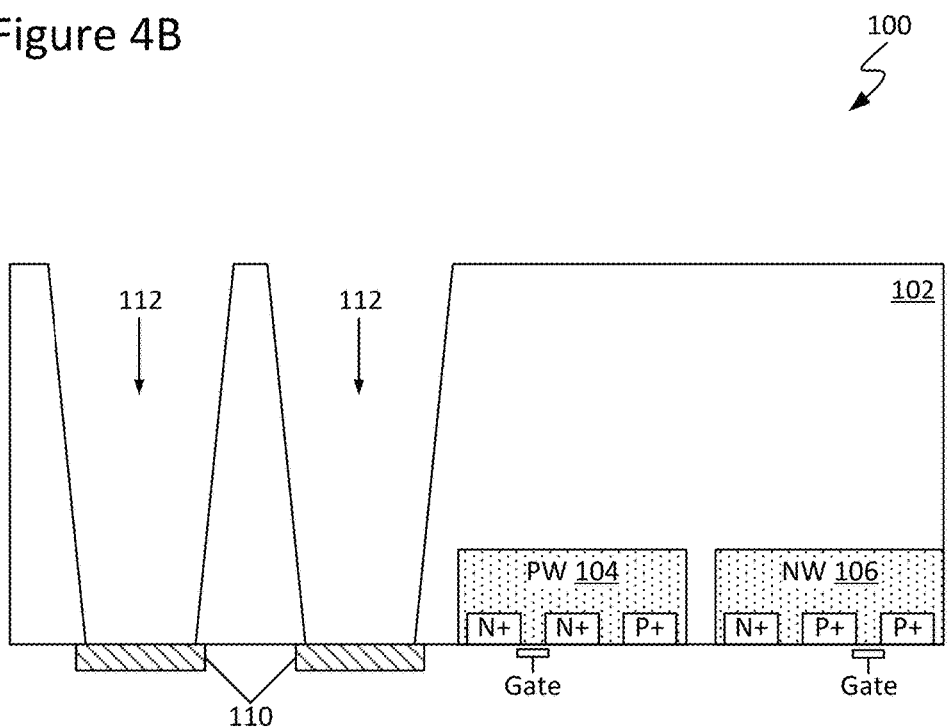
FIG. 4B is a cross-sectional view of the IC of FIG. 4A after forming one or more openings in a semiconductor layer thereof, in accordance with an embodiment of the present disclosure.
Figure 4C:
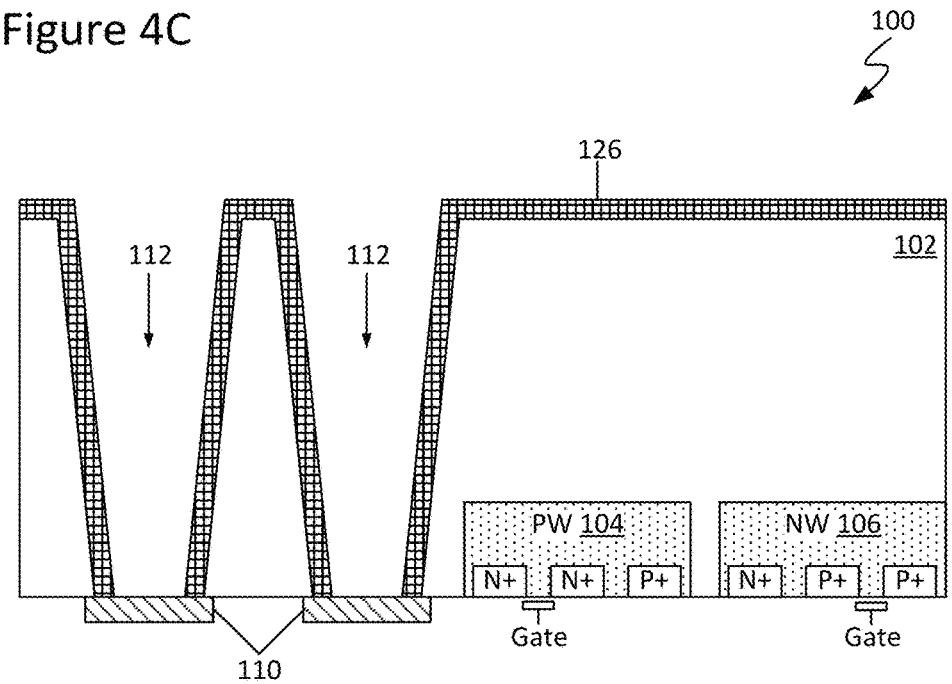
FIG. 4C is a cross-sectional view of the IC of FIG. 4B after forming an isolation liner layer there over, in accordance with an embodiment of the present disclosure.

The process may continue as in FIG. 4C, which is a cross-sectional view of the IC 100 of FIG. 4B after forming an isolation liner layer 126 there over, in accordance with an embodiment of the present disclosure. Isolation liner layer 126 can be formed with any number of suitable diffusion barrier materials, such as, for example, tantalum, tantalum nitride, titanium nitride, tungsten, tungsten nitride, hafnium, niobium, vanadium, and zirconium, or a combination of any thereof, among others, in accordance with some embodiments. Likewise, any of the various materials discussed above with respect to dielectric layer 114 could be used for isolation liner layer 126. Furthermore, the dimensions of isolation liner layer 126 can be customized, as desired for a given target application or end-use. In some example cases, isolation liner layer 126 may have a thickness in the range of about 10-200 µm (e.g., about 10-100 µm, about 100-200 µm, or any other sub-range in the range of about 10-200 µm). In some instances, isolation liner layer 126 may have a substantially uniform thickness over the topography provided by a given opening 112 (or other portion of IC 100), whereas in some other instances, isolation liner layer 126 may have a non-uniform or otherwise varying thickness over such topography (e.g., a first portion of isolation liner layer 126 may have a thickness within a first range, whereas a second portion thereof may have a thickness within a second, different range). In some instances, isolation liner layer 126 may be substantially conformal to the underlying topography provided by a given opening 112 (or other portion of IC 100). In a more general sense, and in accordance with an embodiment, the thickness(es) of isolation liner layer 126 can be tuned to provide the amount of TBV capacitance desired for a given target application or end-use.

Figure 4D:
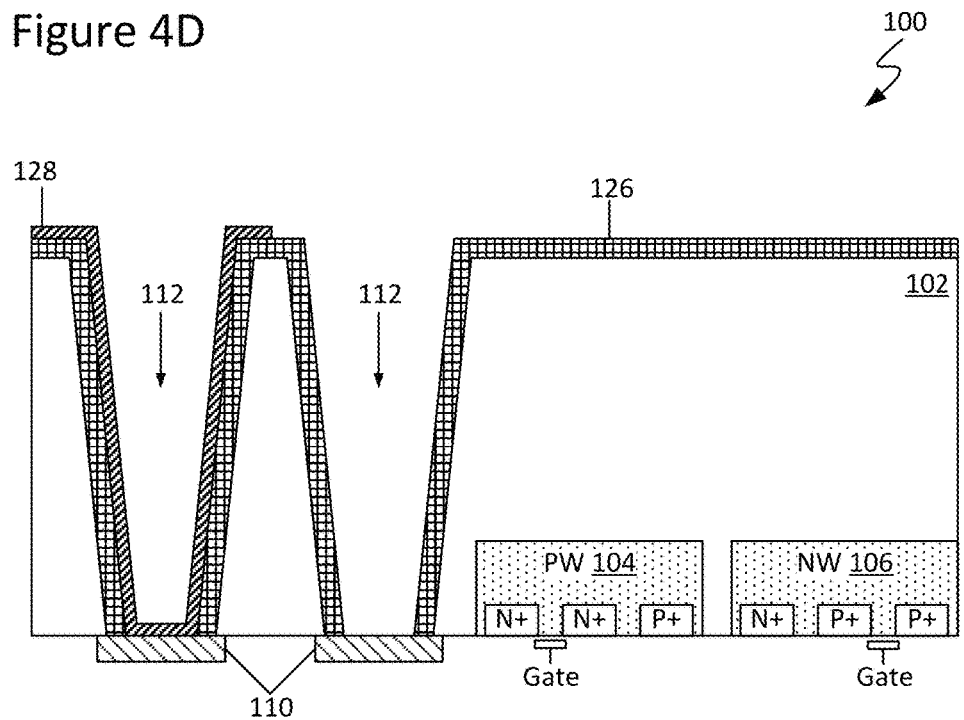
FIG. 4D is a cross-sectional view of the IC of FIG. 4C after forming a conductive layer over the isolation liner layer in the one or more openings, in accordance with an embodiment of the present disclosure.

The process may continue as in FIG. 4D, which is a cross-sectional view of the IC 100 of FIG. 4C after forming a conductive layer 128 over isolation liner layer 126 in an opening 112 of IC 100, in accordance with an embodiment of the present disclosure. Conductive layer 128 provides the outer electrode of the TBV capacitor 118 and can be formed with any of the example materials and techniques discussed above, for instance, with respect to conductive line(s) 110, in accordance with some embodiments. In some cases, conductive layer 128 may be formed, in part or in whole, from an electrically conductive ceramic, such as, for example, titanium nitride. Furthermore, the dimensions of conductive layer 128 can be customized, as desired for a given target application or end-use. In some example cases, conductive layer 128 may have a thickness in the range of about 10-300 nm (e.g., about 10-100 nm, about 100-200 nm, about 200-300 nm, or any other sub-range in the range of about 10-300 nm). In some instances, conductive layer 128 may have a substantially uniform thickness over the topography provided by isolation liner layer 126 in a given opening 112 (or other portion of IC 100), whereas in some other instances, conductive layer 128 may have a non-uniform or otherwise varying thickness over such topography (e.g., a first portion of conductive layer 128 may have a thickness within a first range, whereas a second portion thereof may have a thickness within a second, different range). In some instances, conductive layer 128 may be substantially conformal to the underlying topography provided by isolation liner layer 126 in a given opening 112 (or other portion of IC 100). In a more general sense, and in accordance with an embodiment, the thickness(es) of conductive layer 128 can be tuned to provide the amount of TBV capacitance desired for a given target application or end-use. Conductive layer 128 may be configured to serve, in accordance with an embodiment, as a cathode for the TBV capacitor 118 (see FIG. 4F).

Figure 4E:
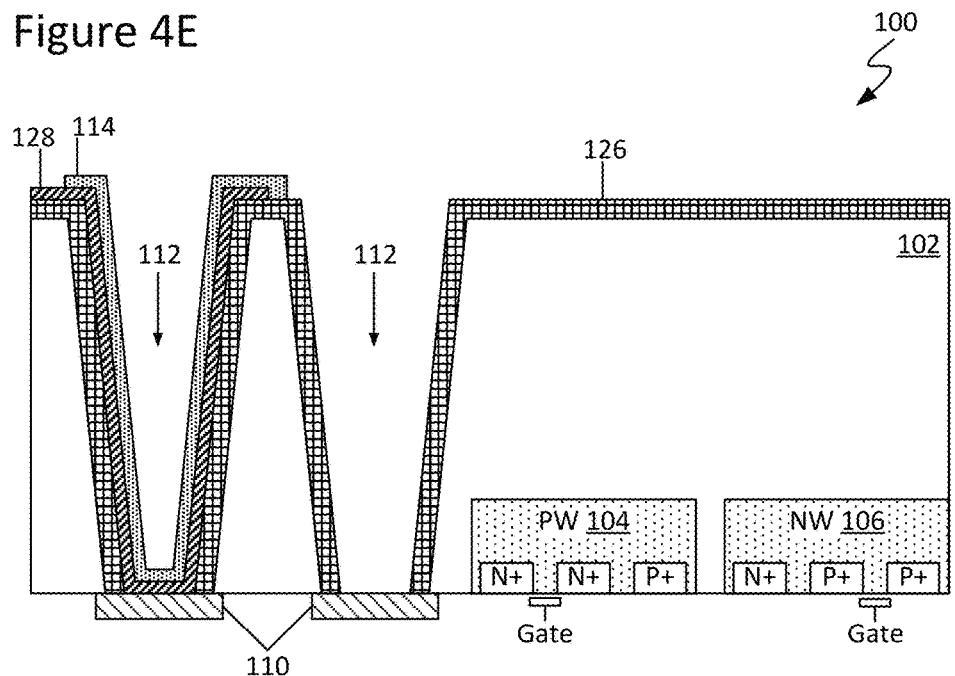
FIG. 4E is a cross-sectional view of the IC of FIG. 4D after forming a liner layer over the conductive layer in the one or more openings, in accordance with an embodiment of the present disclosure.

The process may continue as in FIG. 4E, which is a cross-sectional view of the IC 100 of FIG. 4D after forming a dielectric layer 114 over conductive layer 128 in an opening 112 of IC 100, in accordance with an embodiment of the present disclosure. In some instances, dielectric layer 114 may have a substantially uniform thickness over the topography provided by conductive layer 128 in a given opening 112, whereas in some other instances, dielectric layer 114 may have a non-uniform or otherwise varying thickness over such topography (e.g., a first portion of dielectric layer 114 may have a thickness within a first range, whereas a second portion thereof may have a thickness within a second, different range). In some instances, dielectric layer 114 may be substantially conformal to the underlying topography provided by conductive layer 128 in a given opening 112. In a more general sense, and in accordance with an embodiment, the thickness(es) of dielectric layer 114 can be tuned to provide the amount of TBV capacitance desired for a given target application or end-use.

Figure 4F:
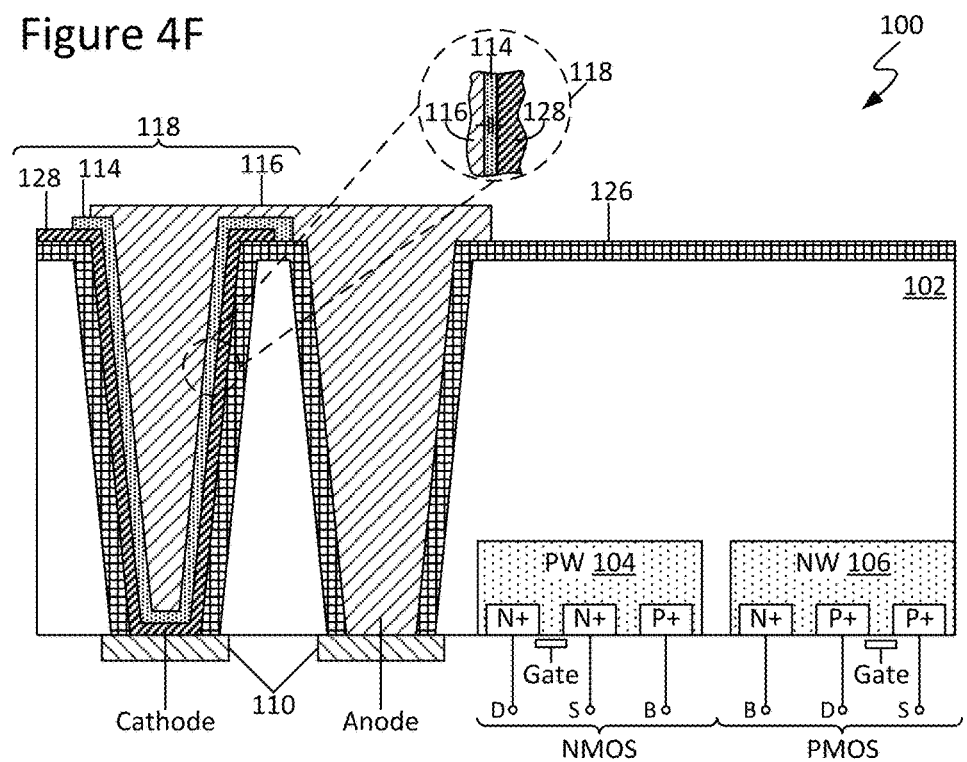
FIG. 4F is a cross-sectional view of the IC of FIG. 4E after forming a through-body via (TBV) in the one or more openings, in accordance with an embodiment of the present disclosure.

The process may continue as in FIG. 4F, which is a cross-sectional view of the IC 100 of FIG. 4E after forming a through-body via (TBV) 116 in each of the two openings 112, in accordance with an embodiment of the present disclosure. As can be seen, the example TBV capacitor 118 structure illustrated in FIG. 4F is configured, in a general sense, like a metal-insulator-metal (MIM) structure, with the TBVs 116 (e.g., the TBV 116 on the right and the TBV 116 on the left are electrically connected with one another) serving as the anode, and the conductive layer 128 on the left serving as the cathode. Electrical connection to the cathode and anode can be provided on the front side or back side (or both) of IC 100, as desired for a given target application or end-use. Similar to the case discussed above with respect to FIGS. 3A-3D, only one TBV 116 (e.g., the TBV 116 on the right) may be needed to route the anode signal from the back side to the front side of IC 100.

FIGS. 5A-5G illustrate an integrated circuit (IC) fabrication process flow, in accordance with another embodiment of the present disclosure. As will be appreciated in light of this disclosure, the process flow of FIGS. 5A-5G is similar to that discussed above with respect to FIGS. 4A-4F, but with TBV processing from the front side of IC 100, similar to that discussed above with respect to FIGS. 2A-2D. The process may begin as in FIG. 5A, which is a cross-sectional view of an IC 100, in accordance with an embodiment of the present disclosure. As can be seen, IC 100 here may include a semiconductor layer 102 and dielectric layer 120 configured substantially similar to the IC 100 described above with respect to FIG. 2A.

Figure 5A:
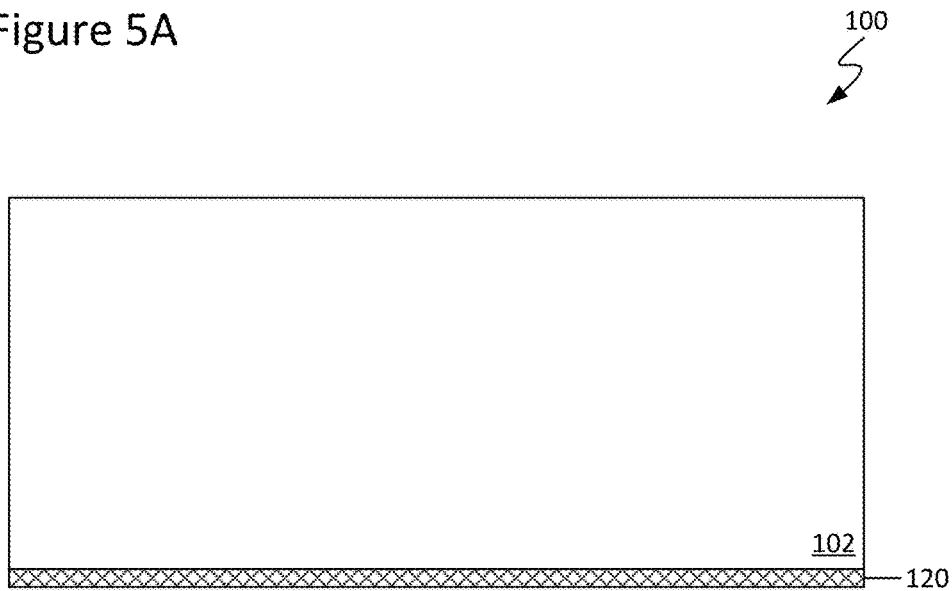
FIG. 5A is a cross-sectional view of an integrated circuit (IC), in accordance with another embodiment of the present disclosure.
Figure 5B:
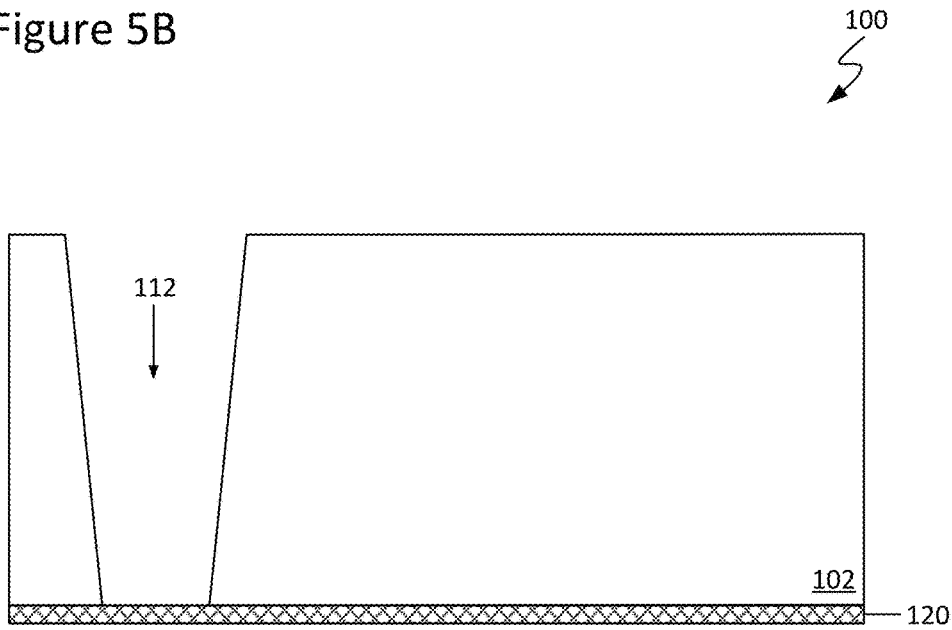
FIG. 5B is a cross-sectional view of the IC of FIG. 5A after forming an opening in a semiconductor layer thereof, in accordance with an embodiment of the present disclosure.

The process may continue as in FIG. 5B, which is a cross-sectional view of the IC 100 of FIG. 5A after forming an opening 112 in semiconductor layer 102, in accordance with an embodiment of the present disclosure. As with FIGS. 2A-2D discussed above, a given opening 112 may be formed, for example, from the front side of semiconductor layer 102 so as to land on dielectric layer 120 formed over the back side of semiconductor layer 102, in accordance with some embodiments.

Figure 5C:
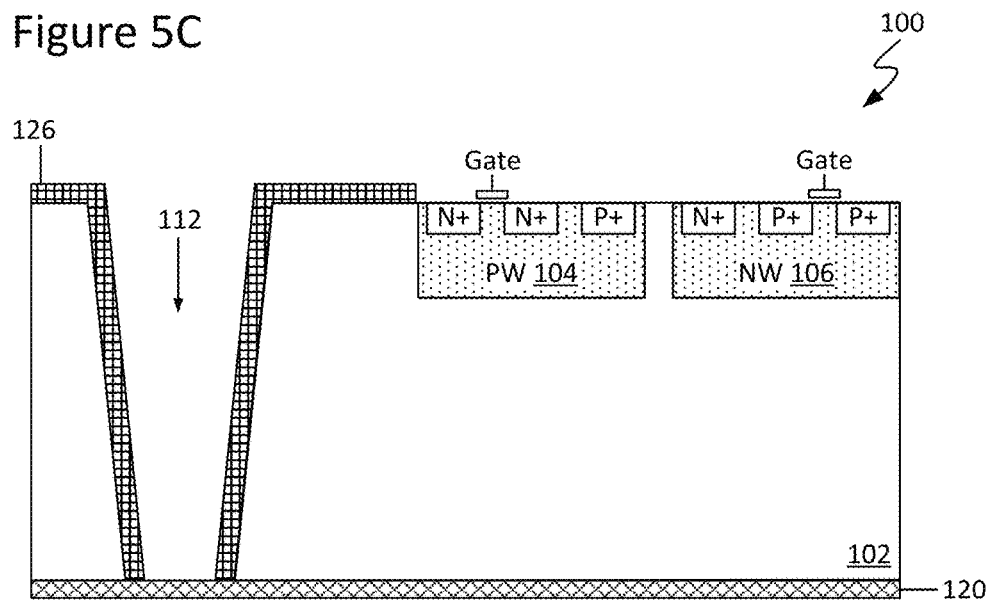
FIG. 5C is a cross-sectional view of the IC of FIG. 5B after forming an isolation liner layer there over, in accordance with an embodiment of the present disclosure.

The process may continue as in FIG. 5C, which is a cross-sectional view of the IC 100 of FIG. 5B after forming an isolation liner layer 126 there over, as well as a p-well (PW) 104 and an n-well (NW) 106 (e.g., with one or more n+ and p+ doped regions) in semiconductor layer 102, in accordance with an embodiment of the present disclosure. Formation of isolation liner layer 126 may involve, in some cases, deposition thereof over IC 100 followed by one or more patterning processes, which may be performed as typically done. Patterning may clear away a portion of isolation liner layer 126 so that a p-well 104, an n-well 106, etc., may be formed in semiconductor layer 102, in accordance with some embodiments. As can be seen, as compared with the IC 100 of FIG. 2A, the IC 100 here may be formed without the one or more p+ taps or deep n-well (DNW) 108, in accordance with an embodiment.

Figure 5D:
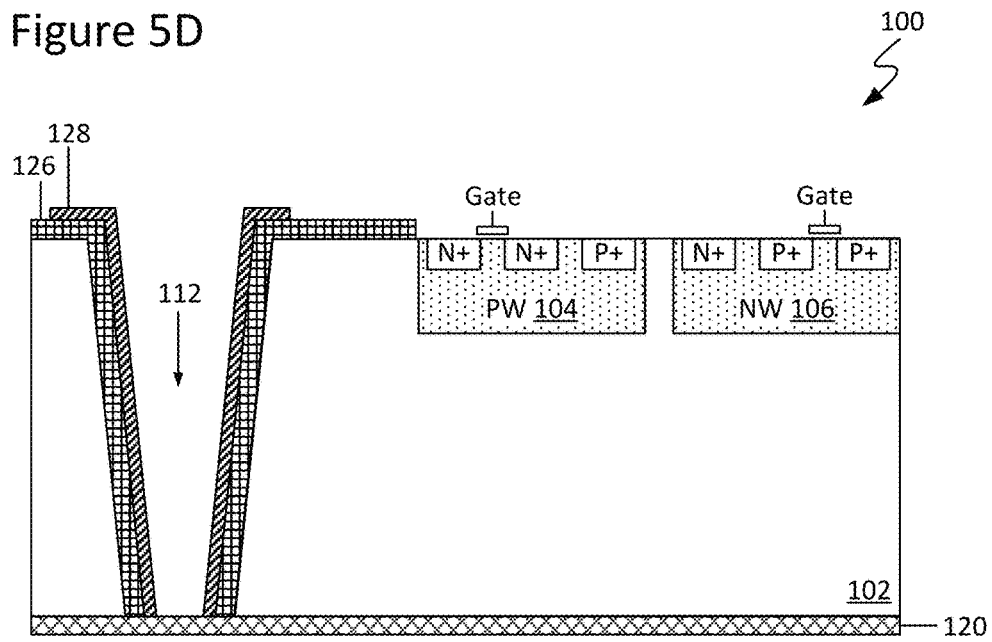
FIG. 5D is a cross-sectional view of the IC of FIG. 5C after forming a conductive layer over the isolation liner layer in the opening, in accordance with an embodiment of the present disclosure.
Figure 5E:
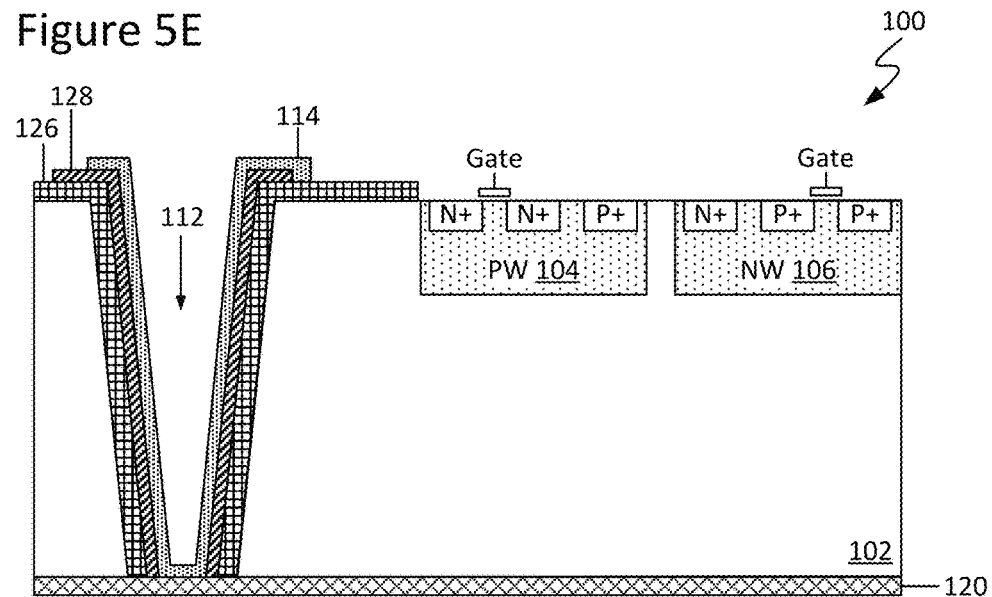
FIG. 5E is a cross-sectional view of the IC of FIG. 5D after forming a liner layer over the conductive layer in the opening, in accordance with an embodiment of the present disclosure.
Figure 5F:
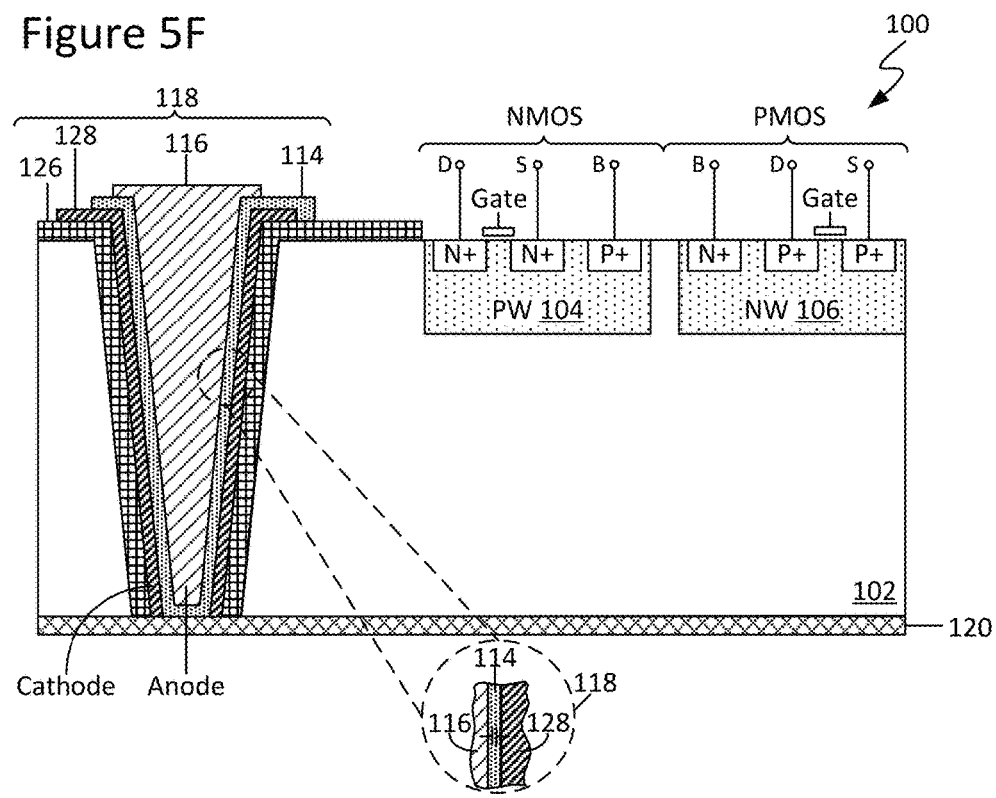
FIG. 5F is a cross-sectional view of the IC of FIG. 5E after forming a through-body via (TBV) in the opening, in accordance with an embodiment of the present disclosure.

The process may continue as in FIGS. 5D-5F, which are cross-sectional views of the IC 100 of FIG. 5C after forming, respectively, a conductive layer 128 over isolation liner layer 126 in an opening 112 (FIG. 5D), a dielectric layer 114 over conductive layer 128 in opening 112 (FIG. 5E), and a TBV 116 in opening 112 (FIG. 5F), in accordance with some embodiments of the present disclosure. In accordance with an embodiment, the combination of the bulk TBV 116, surrounding semiconductor layer 102, and intervening dielectric layer 114 sandwiched there between may provide a TBV capacitor 118, as can be seen, for instance, from the enlarged view enclosed by the dashed circle in FIG. 5F. As will be appreciated in light of this disclosure, and in accordance with some embodiments, an array of such TBV capacitors 118 can be formed in semiconductor layer 102 to provide the amount of TBV capacitance desired for a given target application or end-use.

Figure 5G:
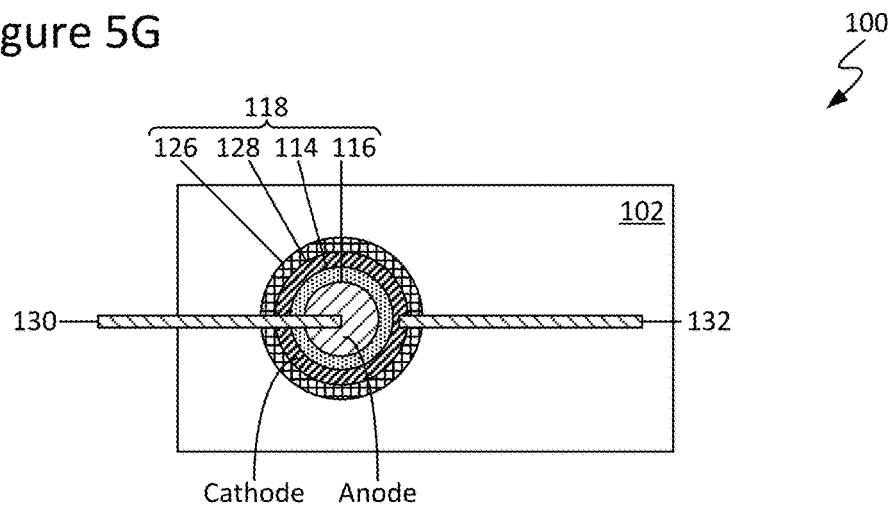
FIG. 5G is a top-down view of the IC of FIG. 5F after patterning with interconnects, in accordance with an embodiment of the present disclosure.

The process may continue as in FIG. 5G, which is a top-down view of the IC 100 of FIG. 5F after patterning with metal lines 130 and 132, in accordance with an embodiment of the present disclosure. As can be seen, additional front side patterning, for example, with a metal line 130 (e.g., metal interconnect) may provide an electrical connection for the anode (e.g., TBV 116), whereas a metal line 132 (e.g., metal interconnect) may provide a separate electrical connection for the concentric cathode (e.g., conductive layer 128). As will be appreciated in light of this disclosure, metal lines 130 and 132 can be formed with any of the example materials, techniques, and dimensions discussed above, for instance, with respect to conductive line(s) 110, in accordance with some embodiments. As will be further appreciated, one or more electrically insulating layers may be provided, for instance, between metal line 130 and underlying conductive layer 128 so as to avoid electrically shorting TBV capacitor 118 in electrically connecting metal line 130 with TBV 116, in accordance with some embodiments. Any suitable dielectric or other electrically insulating material may be used to that end.

Figure 6:
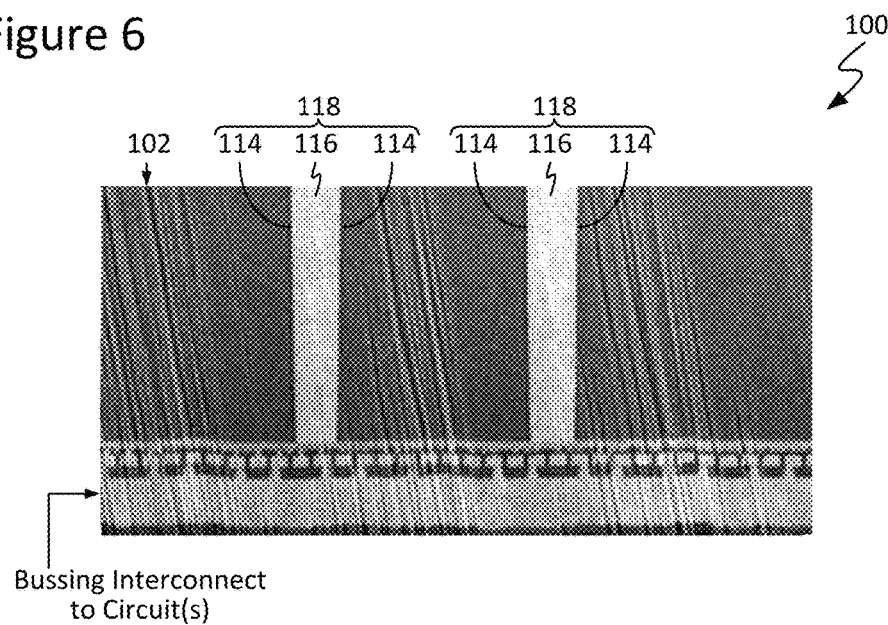
FIG. 6 is a scanning electron microscope (SEM) image illustrating several through-body via (TBV) capacitors configured in accordance with an embodiment of the present disclosure.

Any of the various techniques discussed herein, for example, with respect to FIGS. 1A-1D, 2A-2D, 3A-3D, 4A-4F, and 5A-5G can be used, in part or in whole, to form one or more TBV capacitors 118. FIG. 6 is a scanning electron microscope (SEM) image illustrating several TBV capacitors 118 configured in accordance with an embodiment of the present disclosure. In some instances, an array of TBV capacitors 118 may be formed, the array having a given degree of regularity (or irregularity), as desired for a given target application or end-use. Numerous configurations and variations will be apparent in light of this disclosure.

Example Implementation

In accordance with an example embodiment, a TBV capacitor 118 configured as described herein with a dielectric layer 114 formed, for instance, from hafnium oxide (or other material having a dielectric constant of 12 or higher) may provide about 30 pF (e.g., ±10%) of capacitance. If the TBV 116 of that TBV capacitor 118 occupies an area of about 15 µm×15 µm (e.g., such as is suggested by current JEDEC standard specifications relating to through-body vias), then that TBV capacitor 118 may have an areal capacitance density of about 130 fF/µm$^2$ (e.g., ±10%), in accordance with an example embodiment. As will be appreciated in light of this disclosure, this may be more than a 5× increase in on-chip capacitance density as compared to a typical MIM capacitor. As will be further appreciated, further scaling may further improve on-chip capacitance density, in some cases. If more than 450,000 TBVs 116 (e.g., each occupying an area of about 15 µm×15 µm) can fit in a 100 mm$^2$ chip, then an array of TBV capacitors 118 formed therefrom may provide more capacitance than a typical 14 µF off-chip capacitor, in accordance with an example embodiment.

Example System

Figure 7:
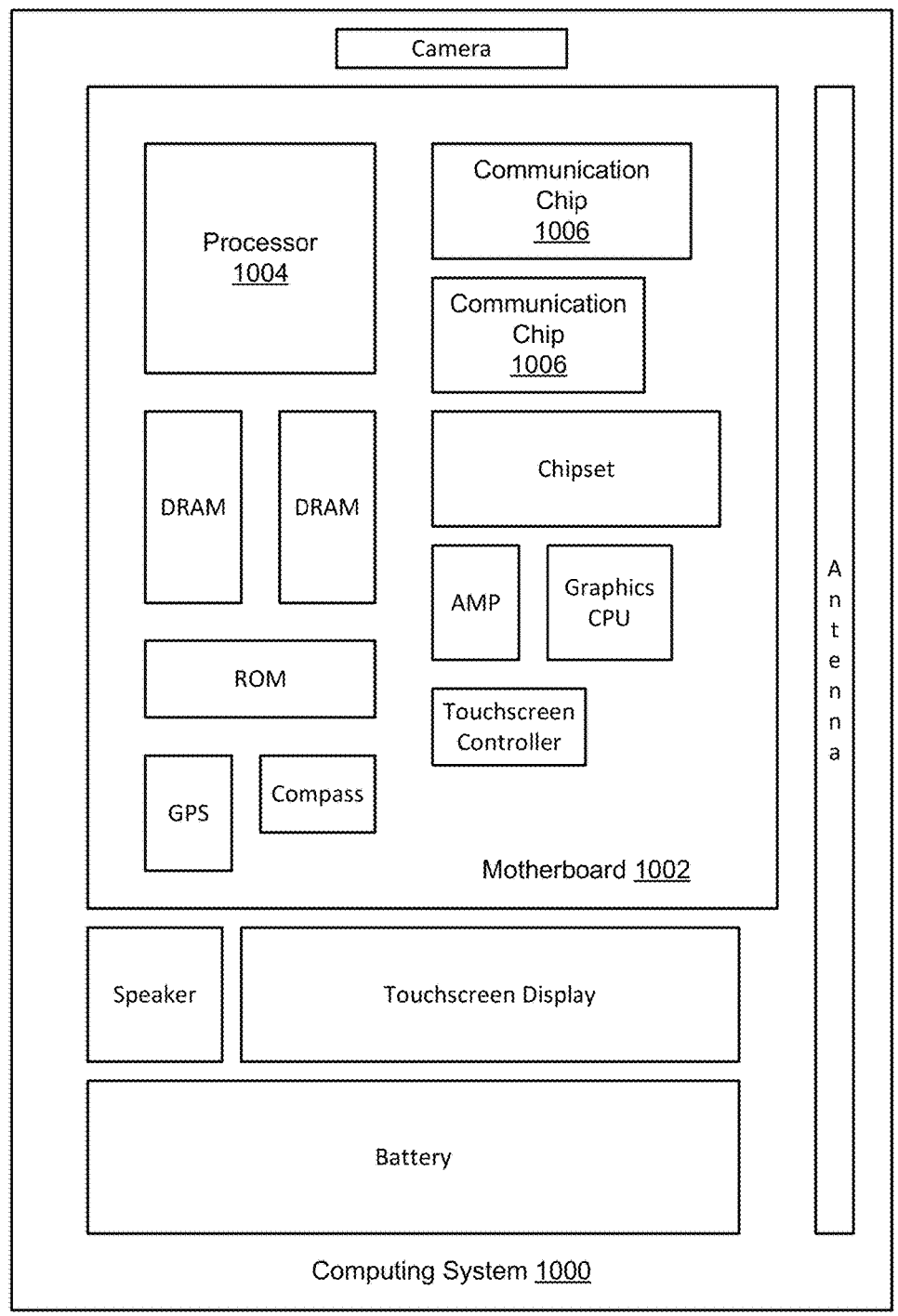
FIG. 7 illustrates a computing system implemented with integrated circuit structures or devices formed using the disclosed techniques in accordance with an example embodiment.

FIG. 7 illustrates a computing system 1000 implemented with integrated circuit structures or devices formed using the disclosed techniques in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as a hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit including a capacitor, the integrated circuit including: a semiconductor layer; a first through-body via (TBV) disposed within the semiconductor layer and providing a first electrode of the capacitor; and a first dielectric layer disposed between the first TBV and the semiconductor layer; wherein a second electrode of the capacitor is provided by either: a low-resistance portion of the semiconductor layer proximate the first TBV; or a conductive layer disposed between the semiconductor layer and the first TBV.

Example 2 includes the subject matter of any of Examples 1 and 3-27, wherein: the semiconductor layer is a bulk substrate in which the first TBV is disposed; and the bulk substrate is doped to provide the low-resistance portion that provides the second electrode of the capacitor.

Example 3 includes the subject matter of any of Examples 1-2 and 4-27, wherein: the semiconductor layer is a bulk layer of a multilayer substrate in which the first TBV is disposed; and the multilayer substrate is doped to provide the low-resistance portion that provides the second electrode of the capacitor.

Example 4 includes the subject matter of Example 3, wherein: the multilayer substrate is a semiconductor-on-insulator (SOI) structure; and the semiconductor layer is the semiconductor layer of the SOI structure.

Example 5 includes the subject matter of any of Examples 1-4 and 6-27, wherein: the semiconductor layer is a bulk substrate in which the first TBV is disposed; and the second electrode of the capacitor is provided by the conductive layer.

Example 6 includes the subject matter of any of Examples 1-5 and 7-27, wherein: the semiconductor layer is a bulk layer of a multilayer substrate in which the first TBV is disposed; and the second electrode of the capacitor is provided by the conductive layer.

Example 7 includes the subject matter of Example 6, wherein: the multilayer substrate is a semiconductor-on-insulator (SOI) structure; and the semiconductor layer is the semiconductor layer of the SOI structure.

Example 8 includes the subject matter of any of Examples 1-7 and 9-27, wherein the first TBV is disposed within a first through-hole formed in the semiconductor layer, the first through-hole extending through the semiconductor layer from a first surface thereof to a second surface thereof.

Example 9 includes the subject matter of Example 8, wherein the first dielectric layer is conformal to a sidewall of the first through-hole.

Example 10 includes the subject matter of Example 8 and further includes a metal interconnect disposed over the first or second surface of the semiconductor layer and electrically connected with the first TBV, wherein the first through-hole lands on the metal interconnect.

Example 11 includes the subject matter of Example 8 and further includes a metal interconnect disposed over the first or second surface of the semiconductor layer and electrically connected with the conductive layer, wherein the first through-hole lands on the metal interconnect.

Example 12 includes the subject matter of Example 8 and further includes an isolation layer disposed within the first through-hole between the first dielectric layer and the semiconductor layer and conformal to a sidewall of the first through-hole, wherein: the conductive layer is disposed within the first through-hole between the first dielectric layer and the isolation layer and conformal to the isolation layer; and the first dielectric layer is conformal to the conductive layer.

Example 13 includes the subject matter of Example 8 and further includes a second dielectric layer disposed over the first or second surface of the semiconductor layer, wherein: the second dielectric layer has a thickness in the range of about 0.1-1.0 µm; and the first through-hole lands on the second dielectric layer.

Example 14 includes the subject matter of Example 8 and further includes: a first metal interconnect disposed over the first or second surface of the semiconductor layer and electrically connected with the conductive layer; and a second metal interconnect disposed over the first or second surface of the semiconductor layer and electrically connected with the first TBV, wherein the second metal interconnect is electrically insulated from the conductive layer.

Example 15 includes the subject matter of any of Examples 1-14 and 16-27 and further includes a second TBV disposed within the semiconductor layer adjacent to the first TBV.

Example 16 includes the subject matter of Example 15 and further includes: a p+ tap portion formed in the semiconductor layer; and a metal interconnect disposed over the first or second surface of the semiconductor layer and electrically connected with the second TBV and the p+ tap portion.

Example 17 includes the subject matter of Example 15, wherein: the second TBV is electrically connected with the first TBV and electrically isolated from the semiconductor layer; and the second electrode of the capacitor is provided by the conductive layer.

Example 18 includes the subject matter of Example 15, wherein: the integrated circuit has a front side and a back side; the first electrode is accessible by a first front side contact aligned with the first TBV; and the second electrode is accessible by a second front side contact aligned with the second TBV.

Example 19 includes the subject matter of Example 15, wherein the second TBV is disposed within a second through-hole formed in the semiconductor layer, the second through-hole extending through the semiconductor layer from a first surface thereof to a second surface thereof.

Example 20 includes the subject matter of Example 19, wherein the first dielectric layer is disposed between the second TBV and the semiconductor layer and is conformal to a sidewall of the second through-hole.

Example 21 includes the subject matter of Example 19 and further includes a metal interconnect disposed over the first or second surface of the semiconductor layer and electrically connected with the second TBV, wherein the second through-hole lands on the metal interconnect.

Example 22 includes the subject matter of any of Examples 1-21 and 23-27, wherein the first dielectric layer has a thickness in the range of about 5-20 nm and includes at least one of hafnium oxide and polyimide.

Example 23 includes the subject matter of any of Examples 1-22 and 24-27, wherein the first TBV has a width in the range of about 5-30 µm.

Example 24 includes the subject matter of any of Examples 1-23 and 25-27, wherein the first TBV has a length in the range of about 50-150 µm.

Example 25 includes the subject matter of any of Examples 1-24 and 26-27, wherein the first TBV has a length-to-width aspect ratio of 5:1 or greater.

Example 26 includes the subject matter of any of Examples 1-25 and 27, wherein the first TBV is of at least one of cylindrical and conical frustum shape.

Example 27 includes the subject matter of any of Examples 1-26 and further includes at least one of a p-well, an n-well, and a deep n-well formed in the semiconductor layer.

Example 28 is a method of forming an integrated circuit including a capacitor, the method including: forming a first through-body via (TBV) in a semiconductor layer, the first TBV providing a first electrode of the capacitor; forming a first dielectric layer between the first TBV and the semiconductor layer; and providing a second electrode of the capacitor by either: forming a low-resistance portion in the semiconductor layer proximate the first TBV; or forming a conductive layer between the semiconductor layer and the first TBV.

Example 29 includes the subject matter of any of Examples 28 and 30-55, wherein: the semiconductor layer is a bulk substrate in which the first TBV is disposed; and the bulk substrate is doped to provide the low-resistance portion that provides the second electrode of the capacitor.

Example 30 includes the subject matter of any of Examples 28-29 and 31-55, wherein: the semiconductor layer is a bulk layer of a multilayer substrate in which the first TBV is disposed; and the multilayer substrate is doped to provide the low-resistance portion that provides the second electrode of the capacitor.

Example 31 includes the subject matter of Example 30, wherein: the multilayer substrate is a semiconductor-on-insulator (SOI) structure; and the semiconductor layer is the semiconductor layer of the SOI structure.

Example 32 includes the subject matter of any of Examples 28-31 and 33-55, wherein: the semiconductor layer is a bulk substrate in which the first TBV is disposed; and the second electrode of the capacitor is provided by the conductive layer.

Example 33 includes the subject matter of any of Examples 28-32 and 34-55, wherein: the semiconductor layer is a bulk layer of a multilayer substrate in which the first TBV is disposed; and the second electrode of the capacitor is provided by the conductive layer.

Example 34 includes the subject matter of Example 33, wherein: the multilayer substrate is a semiconductor-on-insulator (SOI) structure; and the semiconductor layer is the semiconductor layer of the SOI structure.

Example 35 includes the subject matter of any of Examples 28-34 and 36-55, wherein the first TBV is disposed within a first through-hole formed in the semiconductor layer, the first through-hole extending through the semiconductor layer from a first surface thereof to a second surface thereof.

Example 36 includes the subject matter of Example 35, wherein the first dielectric layer is conformal to a sidewall of the first through-hole.

Example 37 includes the subject matter of Example 35 and further includes forming a metal interconnect over the first or second surface of the semiconductor layer and electrically connected with the first TBV, wherein the first through-hole lands on the metal interconnect.

Example 38 includes the subject matter of Example 35 and further includes forming a metal interconnect over the first or second surface of the semiconductor layer and electrically connected with the conductive layer, wherein the first through-hole lands on the metal interconnect.

Example 39 includes the subject matter of Example 35 and further includes forming an isolation layer within the first through-hole between the first dielectric layer and the semiconductor layer and conformal to a sidewall of the first through-hole, wherein: the conductive layer is disposed within the first through-hole between the first dielectric layer and the isolation layer and conformal to the isolation layer; and the first dielectric layer is conformal to the conductive layer.

Example 40 includes the subject matter of Example 35 and further includes forming a second dielectric layer over the first or second surface of the semiconductor layer, wherein: the second dielectric layer has a thickness in the range of about 0.1-1.0 μm; and the first through-hole lands on the second dielectric layer.

Example 41 includes the subject matter of Example 35 and further includes forming a first metal interconnect over the first or second surface of the semiconductor layer and electrically connected with the conductive layer; and forming a second metal interconnect over the first or second surface of the semiconductor layer and electrically connected with the first TBV, wherein the second metal interconnect is electrically insulated from the conductive layer.

Example 42 includes the subject matter of any of Examples 28-41 and 43-55 and further includes forming a second TBV in the semiconductor layer adjacent to the first TBV.

Example 43 includes the subject matter of Example 42 and further includes: forming a p+ tap portion in the semiconductor layer; and forming a metal interconnect over the first or second surface of the semiconductor layer and electrically connected with the second TBV and the p+ tap portion.

Example 44 includes the subject matter of Example 42, wherein: the second TBV is electrically connected with the first TBV and electrically isolated from the semiconductor layer; and the second electrode of the capacitor is provided by the conductive layer.

Example 45 includes the subject matter of Example 42, wherein: the integrated circuit has a front side and a back side; the first electrode is accessible by a first front side contact aligned with the first TBV; and the second electrode is accessible by a second front side contact aligned with the second TBV.

Example 46 includes the subject matter of Example 42, wherein the second TBV is disposed within a second through-hole formed in the semiconductor layer, the second through-hole extending through the semiconductor layer from a first surface thereof to a second surface thereof.

Example 47 includes the subject matter of Example 46, wherein the first dielectric layer is disposed between the second TBV and the semiconductor layer and is conformal to a sidewall of the second through-hole.

Example 48 includes the subject matter of Example 46 and further includes forming a metal interconnect over the first or second surface of the semiconductor layer and electrically connected with the second TBV, wherein the second through-hole lands on the metal interconnect.

Example 49 includes the subject matter of any of Examples 28-48 and 50-55, wherein the first dielectric layer has a thickness in the range of about 5-20 nm and includes at least one of hafnium oxide and polyimide.

Example 50 includes the subject matter of any of Examples 28-49 and 51-55, wherein the first TBV has a width in the range of about 5-30 μm.

Example 51 includes the subject matter of any of Examples 28-50 and 52-55, wherein the first TBV has a length in the range of about 50-150 μm.

Example 52 includes the subject matter of any of Examples 28-51 and 53-55, wherein the first TBV has a length-to-width aspect ratio of 5:1 or greater.

Example 53 includes the subject matter of any of Examples 28-52 and 54-55, wherein the first TBV is of at least one of cylindrical and conical frustum shape.

Example 54 includes the subject matter of any of Examples 28-53 and 55 and further includes forming at least one of a p-well, an n-well, and a deep n-well in the semiconductor layer.

Example 55 is an integrated circuit formed with the subject matter of any of Examples 28-54.

Example 56 is an integrated circuit including a capacitor, the integrated circuit including: a silicon layer; a first copper through-body via (TBV) disposed within the silicon layer and providing a first electrode of the capacitor; and a first dielectric layer disposed between the first copper TBV and the silicon layer; wherein a second electrode of the capacitor is provided by either: a low-resistance portion of the silicon layer proximate the first copper TBV; or a conductive layer disposed between the silicon layer and the first copper TBV.

Example 57 includes the subject matter of any of Examples 56 and 58-82, wherein: the silicon layer is a bulk substrate in which the first copper TBV is disposed; and the bulk substrate is doped to provide the low-resistance portion that provides the second electrode of the capacitor.

Example 58 includes the subject matter of any of Examples 56-57 and 59-82, wherein: the silicon layer is a bulk layer of a multilayer substrate in which the first copper TBV is disposed; and the multilayer substrate is doped to provide the low-resistance portion that provides the second electrode of the capacitor.

Example 59 includes the subject matter of Example 58, wherein: the multilayer substrate is a semiconductor-on-insulator (SOI) structure; and the silicon layer is the semiconductor layer of the SOI structure.

Example 60 includes the subject matter of any of Examples 56-59 and 61-82, wherein: the silicon layer is a bulk substrate in which the first copper TBV is disposed; and the second electrode of the capacitor is provided by the conductive layer.

Example 61 includes the subject matter of any of Examples 56-60 and 62-82, wherein: the silicon layer is a bulk layer of a multilayer substrate in which the first copper TBV is disposed; and the second electrode of the capacitor is provided by the conductive layer.

Example 62 includes the subject matter of Example 61, wherein: the multilayer substrate is a semiconductor-on-insulator (SOI) structure; and the silicon layer is the semiconductor layer of the SOI structure.

Example 63 includes the subject matter of any of Examples 56-62 and 64-82, wherein the first TBV is disposed within a first through-hole formed in the silicon layer, the first through-hole extending through the silicon layer from a first surface thereof to a second surface thereof.

Example 64 includes the subject matter of Example 63, wherein the first dielectric layer is conformal to a sidewall of the first through-hole.

Example 65 includes the subject matter of Example 63 and further includes a metal interconnect disposed over the first or second surface of the silicon layer and electrically connected with the first copper TBV, wherein the first through-hole lands on the metal interconnect.

Example 66 includes the subject matter of Example 63 and further includes a metal interconnect disposed over the first or second surface of the silicon layer and electrically connected with the conductive layer, wherein the first through-hole lands on the metal interconnect.

Example 67 includes the subject matter of Example 63 and further includes an isolation layer disposed within the first through-hole between the first dielectric layer and the silicon layer and conformal to a sidewall of the first through-hole, wherein: the conductive layer is disposed within the first through-hole between the first dielectric layer and the isolation layer and conformal to the isolation layer; and the first dielectric layer is conformal to the conductive layer.

Example 68 includes the subject matter of Example 63 and further includes a second dielectric layer disposed over the first or second surface of the silicon layer, wherein: the second dielectric layer has a thickness in the range of about 0.1-1.0 µm; and the first through-hole lands on the second dielectric layer.

Example 69 includes the subject matter of Example 63 and further includes: a first metal interconnect disposed over the first or second surface of the silicon layer and electrically connected with the conductive layer; and a second metal interconnect disposed over the first or second surface of the silicon layer and electrically connected with the first TBV, wherein the second metal interconnect is electrically insulated from the conductive layer.

Example 70 includes the subject matter of any of Examples 56-69 and 71-82 and further includes a second copper TBV disposed within the silicon layer adjacent to the first copper TBV.

Example 71 includes the subject matter of Example 70 and further includes: a p+ tap portion formed in the silicon layer; and a metal interconnect disposed over the first or second surface of the silicon layer and electrically connected with the second copper TBV and the p+ tap portion.

Example 72 includes the subject matter of Example 70, wherein: the second copper TBV is electrically connected with the first copper TBV and electrically isolated from the silicon layer; and the second electrode of the capacitor is provided by the conductive layer.

Example 73 includes the subject matter of Example 70, wherein: the integrated circuit has a front side and a back side; the first electrode is accessible by a first front side contact aligned with the first copper TBV; and the second electrode is accessible by a second front side contact aligned with the second copper TBV.

Example 74 includes the subject matter of Example 70, wherein the second copper TBV is disposed within a second through-hole formed in the silicon layer, the second through-hole extending through the silicon layer from a first surface thereof to a second surface thereof.

Example 75 includes the subject matter of Example 74, wherein the first dielectric layer is disposed between the second copper TBV and the silicon layer and is conformal to a sidewall of the second through-hole.

Example 76 includes the subject matter of Example 74 and further includes a metal interconnect disposed over the first or second surface of the silicon layer and electrically connected with the second copper TBV, wherein the second through-hole lands on the metal interconnect.

Example 77 includes the subject matter of any of Examples 56-76 and 78-82, wherein the first dielectric layer has a thickness in the range of about 5-20 nm and includes at least one of hafnium oxide ($HfO_2$) and polyimide.

Example 78 includes the subject matter of any of Examples 56-77 and 79-82, wherein the silicon layer is p-doped silicon having a resistivity in the range of about 0.001-10.0 Ω·cm.

Example 79 includes the subject matter of any of Examples 56-78 and 80-82 and further includes at least one of a p-well, an n-well, and a deep n-well formed in the semiconductor layer.

Example 80 includes the subject matter of Example 79 and further includes at least one of: a p-type metal-oxide-semiconductor (PMOS) device; and an n-type metal-oxide-semiconductor (NMOS) device.

Example 81 includes the subject matter of any of Examples 56-80 and 82, wherein the integrated circuit is configured to serve as a battery that is able to at least one of: charge itself using energy harvested from an external source; discharge itself by emitting a high-voltage pulse; and recharge itself after discharge.

Example 82 is a charge pump formed with the subject matter of any of Examples 56-81.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. An integrated circuit including a capacitor, the integrated circuit comprising:
   a semiconductor layer;
   a first through-body via (TBV) within the semiconductor layer, the first TBV provides a first electrode of the capacitor, the first TBV within a first through-hole in the semiconductor layer, the first through-hole extending through the semiconductor layer from a first surface thereof to a second surface thereof;
   a first dielectric layer between the first TBV and the semiconductor layer;
   a conductive layer between the semiconductor layer and the first TBV, the conductive layer provides a second electrode of the capacitor;
   a first metal interconnect over the first or second surface of the semiconductor layer and electrically connected with the conductive layer; and
   a second metal interconnect over the first or second surface of the semiconductor layer and electrically connected with the first TBV, wherein the second metal interconnect is electrically insulated from the conductive layer.

2. An integrated circuit including a capacitor, the integrated circuit comprising:
   a semiconductor layer;
   a first through-body via (TBV) within the semiconductor layer, the first TBV provides a first electrode of the capacitor;
   a first dielectric layer between the first TBV and the semiconductor layer;
   a conductive layer between the semiconductor layer and the first TBV, the conductive layer provides a second electrode of the capacitor;
   a second TBV within the semiconductor layer adjacent to the first TBV;
   a p+ tap portion in the semiconductor layer; and a metal interconnect over the first or second surface of the semiconductor layer and electrically connected with the second TBV and the p+ tap portion.

3. The integrated circuit of claim 1, wherein the semiconductor layer is a bulk substrate.

4. The integrated circuit of claim 3, wherein the bulk substrate is doped to provide the low-resistance portion that provides the second electrode of the capacitor.

5. The integrated circuit of claim 1, wherein the semiconductor layer is a bulk layer of a multilayer substrate.

6. The integrated circuit of claim 1, wherein:
the first TBV is within a first through-hole formed in the semiconductor layer, the first through-hole extending through the semiconductor layer from a first surface thereof to a second surface thereof; and
the first dielectric layer is conformal to a sidewall of the first through-hole.

7. The integrated circuit of claim 1, further comprising a second TBV within the semiconductor layer adjacent to the first TBV, wherein the second TBV is electrically connected with the first TBV and electrically isolated from the semiconductor layer.

8. The integrated circuit of claim 1, further comprising a second TBV within the semiconductor layer adjacent to the first TBV, wherein:
the second TBV is within a second through-hole in the semiconductor layer, the second through-hole extending through the semiconductor layer from a first surface thereof to a second surface thereof; and
the first dielectric layer is between the second TBV and the semiconductor layer and is conformal to a sidewall of the second through-hole.

9. The integrated circuit of claim 2, wherein:
the semiconductor layer is a bulk layer of a multilayer substrate; and
the multilayer substrate is doped to provide the low-resistance portion that provides the second electrode of the capacitor.

10. The integrated circuit of claim 2, wherein:
the first TBV is within a first through-hole formed in the semiconductor layer, the first through-hole extending through the semiconductor layer from a first surface thereof to a second surface thereof; and
the first dielectric layer is conformal to a sidewall of the first through-hole.

11. The integrated circuit of claim 2, further comprising a second TBV within the semiconductor layer adjacent to the first TBV, wherein the second TBV is electrically connected with the first TBV and electrically isolated from the semiconductor layer.

12. An integrated circuit including a capacitor, the integrated circuit comprising:
a semiconductor layer;
a first through-body via (TBV) within the semiconductor layer, the first TBV provides a first electrode of the capacitor, the first TBV within a first through-hole in the semiconductor layer, the first through-hole extending through the semiconductor layer from a first surface thereof to a second surface thereof; a first dielectric layer between the first TBV and the semiconductor layer;
an isolation layer within the first through-hole between the first dielectric layer and the semiconductor layer and conformal to a sidewall of the first through-hole; and the conductive layer within the first through-hole between the first dielectric layer and the isolation layer and conformal to the isolation layer, the conductive layer provides a second electrode of the capacitor; wherein the first dielectric layer is conformal to the conductive layer.

13. The integrated circuit of claim 12, wherein: the semiconductor layer is a bulk substrate; and the bulk substrate is doped to provide the low-resistance portion that provides the second electrode of the capacitor.

14. The integrated circuit of claim 12, wherein: the semiconductor layer is a bulk layer of a multilayer substrate; and the multilayer substrate is doped to provide the low-resistance portion that provides the second electrode of the capacitor.

15. The integrated circuit of claim 12, wherein: the semiconductor layer is a bulk substrate.

16. The integrated circuit of claim 12, wherein: the semiconductor layer is a bulk layer of a multilayer substrate.

17. The integrated circuit of claim 16, wherein: the multilayer substrate is a semiconductor-on-insulator (SOI) structure; and the semiconductor layer is the semiconductor layer of the SOI structure.

18. The integrated circuit of claim 12, wherein: the first TBV within a first through-hole formed in the semiconductor layer, the first through-hole extending through the semiconductor layer from a first surface thereof to a second surface thereof; and the first dielectric layer is conformal to a sidewall of the first through-hole.

19. The integrated circuit of claim 12, further comprising a second TBV within the semiconductor layer adjacent to the first TBV, wherein: the second TBV is electrically connected with the first TBV and electrically isolated from the semiconductor layer.

20. The integrated circuit of claim 12, further comprising a second TBV within the semiconductor layer adjacent to the first TBV, wherein: the second TBV is within a second through-hole in the semiconductor layer, the second through-hole extending through the semiconductor layer from a first surface thereof to a second surface thereof: and the first dielectric layer is between the second TBV and the semiconductor layer and is conformal to a sidewall of the second through-hole.

* * * * *